US012652850B2

(12) United States Patent
Guler et al.

(10) Patent No.: US 12,652,850 B2
(45) Date of Patent: Jun. 9, 2026

(54) SPACER SELF-ALIGNED VIA STRUCTURES USING ASSISTED GRATING FOR GATE CONTACT OR TRENCH CONTACT

(71) Applicant: Intel Corporation, Santa Clara, CA (US)

(72) Inventors: Leonard P. Guler, Hillsboro, OR (US); Tsuan-Chung Chang, Portland, OR (US); Charles H. Wallace, Portland, OR (US); Tahir Ghani, Portland, OR (US); Desalegne B. Teweldebrhan, Sherwood, OR (US)

(73) Assignee: Intel Corporation, Santa Clara, CA (US)

( * ) Notice: Subject to any disclaimer, the term of this patent is extended or adjusted under 35 U.S.C. 154(b) by 343 days.

(21) Appl. No.: 17/693,141

(22) Filed: Mar. 11, 2022

(65) Prior Publication Data
US 2023/0290841 A1　　Sep. 14, 2023

(51) Int. Cl.
*H10D 64/23* (2025.01)
*B82Y 10/00* (2011.01)
(Continued)

(52) U.S. Cl.
CPC ................................. *H10D 64/258* (2025.01)

(58) Field of Classification Search
CPC .. H10D 30/6219; H10D 30/024; H10D 30/62; H10D 64/511; H10D 84/0135; H10D 30/658; H10D 84/0172; H10D 64/27; H10D 64/311; H10D 64/411; H10D 64/517; H10D 64/518; H10D 64/519;

H10D 64/258; H10D 84/0149; H10D 84/0158; H01L 21/76895; H01L 21/76897; H01L 23/5226;
(Continued)

(56) References Cited

U.S. PATENT DOCUMENTS

| 9,349,812 | B2 | 5/2016 | Chen |
| 9,461,143 | B2 | 10/2016 | Pethe |

(Continued)

OTHER PUBLICATIONS

Extended European Search Report for European Patent Application No. 22168974.8 mailed Oct. 19, 2022, 7 pgs.
(Continued)

*Primary Examiner* — Sonya McCall-Shepard
(74) *Attorney, Agent, or Firm* — Schwabe, Williamson & Wyatt, P.C.

(57) ABSTRACT

Spacer self-aligned via structures for gate contact or trench contact are described. In an example, an integrated circuit structure includes a plurality of gate structures above a substrate. A plurality of conductive trench contact structures is alternating with the plurality of gate structures. A corresponding one of a plurality of dielectric spacers is between adjacent ones of the plurality of gate structures and the plurality of conductive trench contact structures. The plurality of dielectric spacers protrudes above the plurality of gate structures and above the plurality of conductive trench contact structures. A conductive structure is in direct contact with one of the plurality of gate structures or with one of the plurality of conductive trench contact structures. The conductive structure has a flat edge along a direction across the one of the plurality of gate structures or the one of the plurality of conductive trench contact structures.

10 Claims, 18 Drawing Sheets

(51) Int. Cl.

| | |
|---|---|
| *H10D 30/43* | (2025.01) |
| *H10D 30/67* | (2025.01) |
| *H10D 62/10* | (2025.01) |
| *H10D 64/01* | (2025.01) |
| *H10D 64/27* | (2025.01) |
| *H10D 84/01* | (2026.01) |
| *H10D 84/03* | (2025.01) |
| *H10D 84/83* | (2025.01) |
| *H10W 20/00* | (2026.01) |

(58) Field of Classification Search
CPC ............. H01L 23/528; H01L 21/76805; H01L 21/76816; H01L 21/76843; H10W 20/069; H10W 20/0693; H10W 20/0698
See application file for complete search history.

(56) References Cited

U.S. PATENT DOCUMENTS

| | | | | |
|---|---|---|---|---|
| 9,570,573 | B1 * | 2/2017 | Fan | .................... H01L 21/31053 |
| 10,566,285 | B2 | 2/2020 | Hsu | |
| 10,651,284 | B2 * | 5/2020 | Xie | ........................ H10D 84/85 |
| 10,755,976 | B2 | 8/2020 | Cheng | |
| 11,664,237 | B2 | 5/2023 | Huang | |

| | | | | |
|---|---|---|---|---|
| 2014/0346575 | A1 | 11/2014 | Chen | |
| 2017/0323852 | A1 | 11/2017 | Hsu | |
| 2018/0076086 | A1 * | 3/2018 | Clevenger | ......... H01L 21/76897 |
| 2018/0315762 | A1 * | 11/2018 | Kim | ..................... H10D 84/834 |
| 2018/0342420 | A1 | 11/2018 | You | |
| 2019/0131430 | A1 | 5/2019 | Xie | |
| 2020/0105577 | A1 | 4/2020 | Liang | |
| 2020/0212189 | A1 | 7/2020 | Tan | |
| 2020/0335594 | A1 | 10/2020 | Zang | |
| 2021/0066470 | A1 * | 3/2021 | Huang | .............. H01L 21/76834 |
| 2021/0384316 | A1 * | 12/2021 | Yu | ..................... H01L 21/76895 |

OTHER PUBLICATIONS

Office Action from U.S. Appl. No. 17/339,001, mailed Jan. 29, 2025, 12 pgs.

Office Action from U.S. Appl. No. 17/339,001, mailed May 30, 2025, 13 pgs.

Office Action from U.S. Appl. No. 17/710,827, mailed May 29, 2025, 21 pgs.

Office Action from European Patent Application No. 22168974.8 mailed Sep. 5, 2025, 4 pgs.

Notice of Allowance from U.S. Appl. No. 17/710,827, mailed Oct. 31, 2025, 9 pgs.

* cited by examiner

500

510       510       510

506

502

504   506    508   506   504   506    508   506   504   506

510

504      508A        508A

SPACER SELF-ALIGNED VIA STRUCTURES USING ASSISTED GRATING FOR GATE CONTACT OR TRENCH CONTACT

TECHNICAL FIELD

Embodiments of the disclosure are in the field of advanced integrated circuit structure fabrication and, in particular, spacer self-aligned via structures for gate contact or trench contact.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

In the manufacture of integrated circuit devices, multi-gate transistors, such as tri-gate transistors, have become more prevalent as device dimensions continue to scale down. Tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

DESCRIPTION OF THE EMBODIMENTS

Figure 1A:
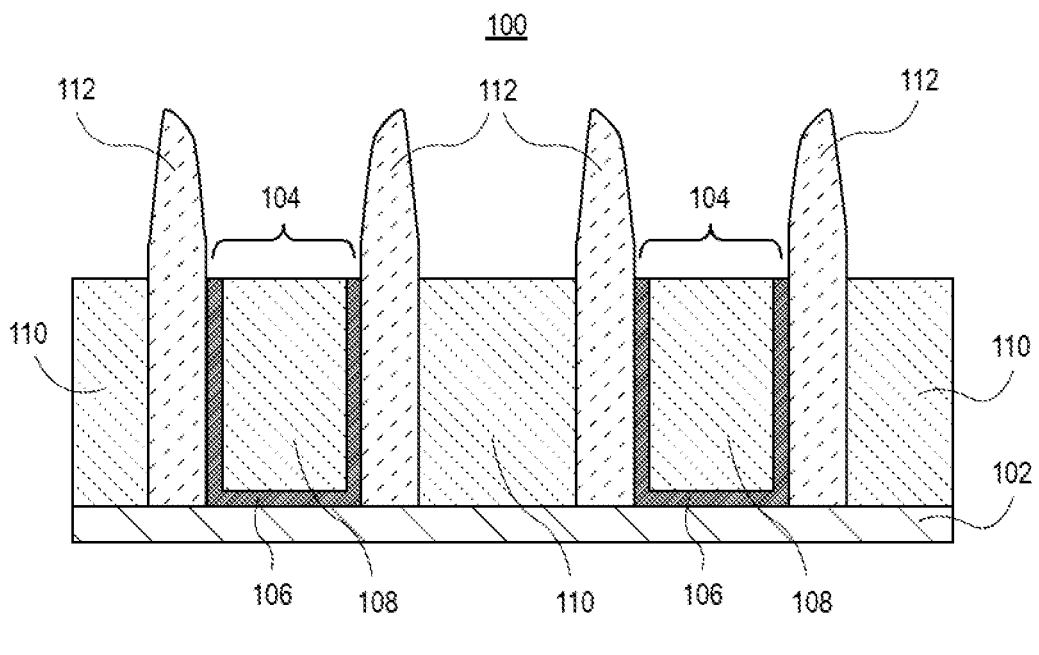
FIGS. 1A-1E illustrate cross-sectional views illustrating various operations in a method of fabricating a spacer self-aligned via structures for gate contact, in accordance with an embodiment of the present disclosure.

Spacer self-aligned via structures for gate contact or trench contact, and methods of fabricating spacer self-aligned via structures for gate contact or trench contact, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

In accordance with an embodiment of the present disclosure, spacer self-aligned via (SSAV) structures and processes are described. In accordance with an embodiment of the present disclosure, contact over active gate (COAG) structures and processes are described. One or more embodiments of the present disclosure are directed to semiconductor structures or devices having one or more gate contact structures (e.g., as gate contact vias) disposed over active portions of gate electrodes of the semiconductor structures or devices. One or more embodiments of the present disclosure are directed to methods of fabricating semiconductor structures or devices having one or more gate contact structures formed over active portions of gate electrodes of the semiconductor structures or devices. Approaches described herein may be used to reduce a standard cell area by enabling gate contact formation over active gate regions. In accordance with one or more embodiments, gate contacts or trench contacts are implemented according to processes described herein. In certain implementations a grating assisted approach is used in conjunction with a gate spacer aligned contact process scheme.

To provide context, some implementations of Contact-Over-Active-Gate require a selective ("color") etch. An associated process window for the etch may be insufficient. For example, defect modes of opens and shorts may persistently degrade the manufacturing yield. The open circuit defect may also attributed to damascene metallization that is not able to fill into deep and tight spaces. For example, recessing a gate and refilling with SiN followed by recessing the trench contact (TCN) and replacing with SiC or SiOx to establish etch selectivity between the two materials can require outstanding etch selectivity which can be difficult to achieve at scaled dimensions. Another option involves recessing the gate relative to the TCN. The height offset can enable enough edge placement error margin to drop contacts over active gates without shorting. However, such an approach can require a complex liner and helmet flow and multiple polish operations.

In accordance with one or more embodiments described herein, a gate and source/drain (S/D) metals are recessed below a spacer that is between the gate and S/D, and an additional liner is used to extend a process window utilizing controlled isotropic etch of the liner. Approaches described herein may be more facile to implement than state-of-the-art approaches, and can provide with good process margin. Approaches described herein may be viewed as a COAG method with reduced etch requirements and process operations. In particular embodiments, approaches can be implemented to enable about +/−10 nm edge placement error (EPE) process margin. Additionally, trench contact via (VCT) and gate contact via (VCG) structures can be patterned together or split. Embodiments may only need a shorter starting gate height than other COAG approaches.

As a baseline exemplary processing scheme, FIGS. 1A-1E illustrate cross-sectional views illustrating various operations in a method of fabricating a spacer self-aligned via structures for gate contact, in accordance with an embodiment of the present disclosure.

Referring to FIG. 1A, a starting structure 100 includes a plurality of gate structures 104 above a substrate 102. The gate structures 104 can each include a gate electrode 108 and a gate dielectric 106. Dielectric spacers 112 are formed along sides of the gate structures 104. Conductive trench contact structures 110 are between the dielectric spacers 112 of adjacent gate structures 104. The conductive trench contact structures 110 and the gate structures 104 are recessed relative to the dielectric spacers 112. In one embodiment, the recessed conductive trench contact structures 110 and the gate structures 104 have a top surface co-planar with one another, as is depicted. In another embodiment, the conductive trench contact structures 110 have a top surface above the top surface of the gate structures 104. In another embodiment, the conductive trench contact structures 110 have a top surface below the top surface of the gate structures 104. In one embodiment, the dielectric spacers 112 protrude about 15 nm above the conductive trench contact structures 110 and the gate structures 104.

Figure 1B:
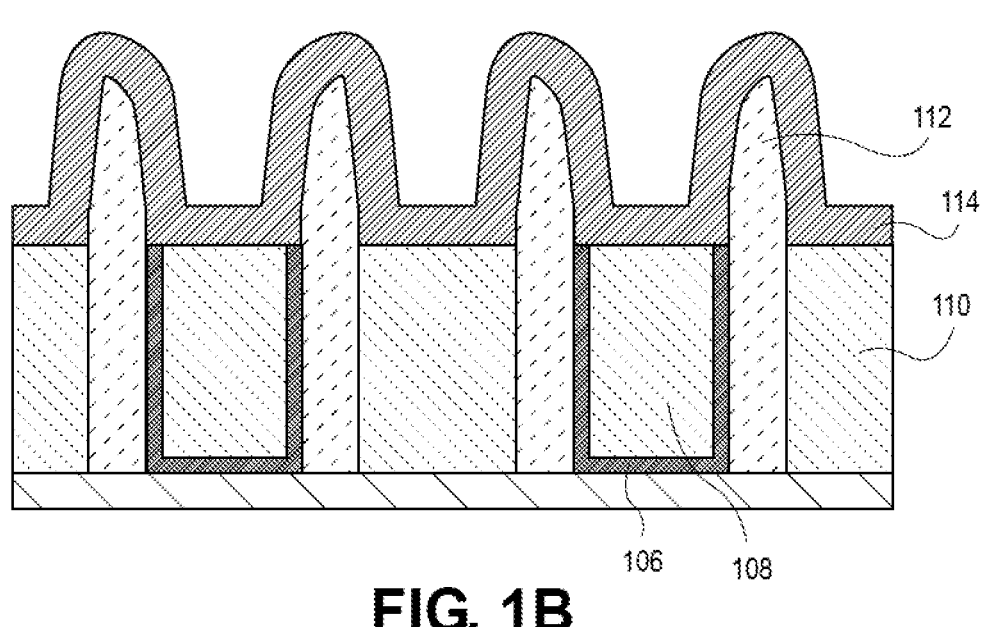

Referring to FIG. 1B, a dielectric liner 114 is formed conformally on the structure of FIG. 1A. In an embodiment, the dielectric liner 114 is composed of aluminum oxide, $Al_2O_3$. In an embodiment, the dielectric liner 114 is formed using atomic layer deposition (ALD). In an embodiment, the dielectric liner 114 has a thickness of about 5 nm.

Figures 1C, 1D:
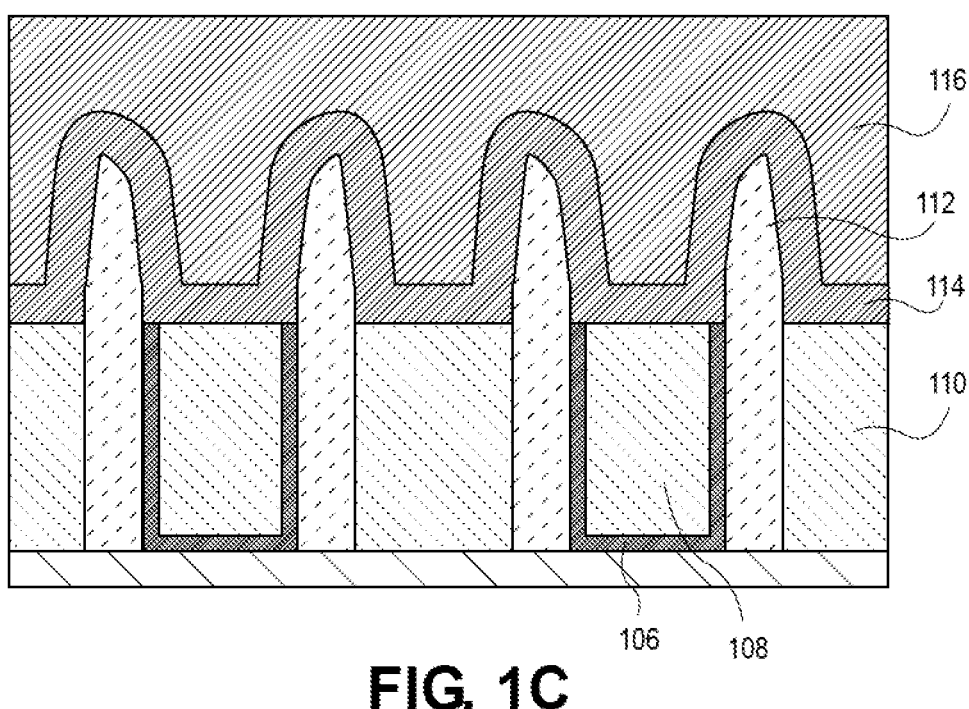

Referring to FIG. 1C, an interlayer dielectric layer 116 is formed on the structure of FIG. 1B. In one embodiment, the interlayer dielectric layer 116 is composed of $SiO_2$.

Referring to FIG. 1D, openings 118A and 118B are formed in the interlayer dielectric layer 116, e.g., by a lithography and etch process, to form patterned interlayer dielectric layer 116A. The opening 118A is onset over one of the gate structures 104. The opening 118B is offset over another of the gate structures 104.

Figure 1E:
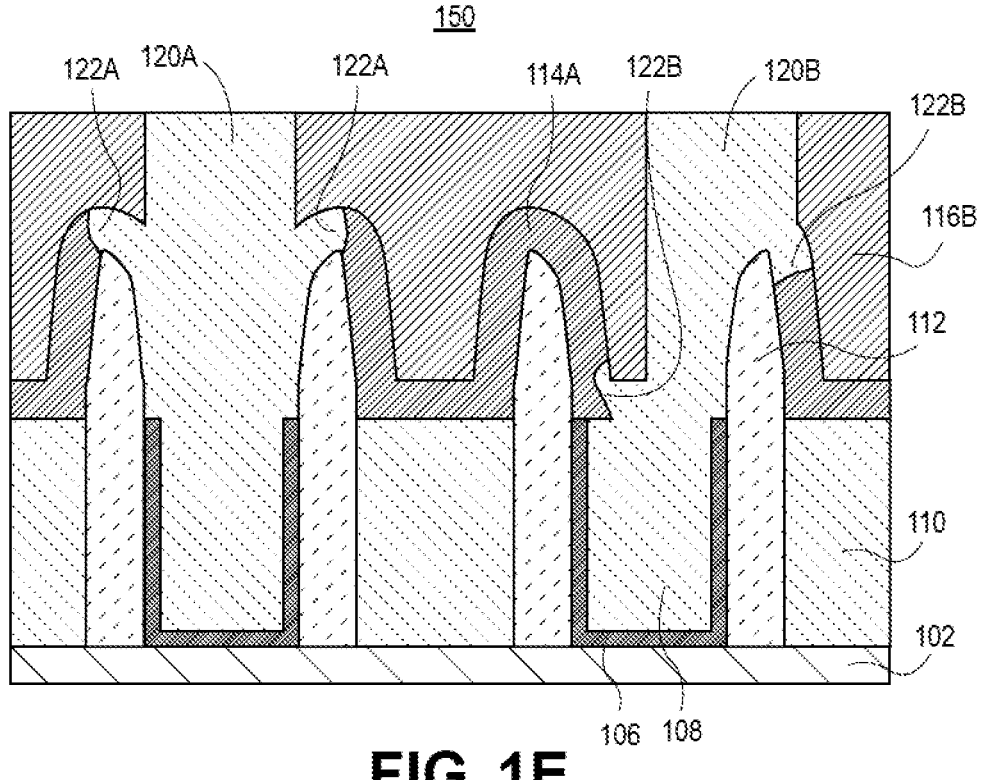

Referring to FIG. 1E, the dielectric liner 114 is etched through the openings 118A and 118B. The etch may isotropic and etch portions of the dielectric liner 114 vertically beneath the patterned interlayer dielectric layer 116A to form interlayer dielectric layer 116B, as is depicted.

Referring again to FIG. 1E, a conductive material is formed over the structure and can planarized to form conductive structure 120A and 120B in openings 118A and 118B, respectively. The conductive structures 120A and 120B can have features 122A and 122B, respectively, that are vertically beneath the interlayer dielectric layer 116B, as is depicted. In an embodiment, the conductive structures 120A and 120B include a same conductive fill as the underlying gate structure 104 and effectively, form a unitary structure, as is depicted. In other embodiments, a liner and a fill are used to form conductive structures 120A and 120B. It is to be appreciated that a patterned conductive liner 114A can be present in a completed product. It is also to be appreciated that a reduced overlap area with the registration offset may not produce significant contact resistance change.

With reference again to FIG. 1E, in accordance with an embodiment of the present disclosure, an integrated circuit structure 150 includes a plurality of gate structures 104 (106/108) above a substrate 102. A plurality of conductive trench contact structures 110 is alternating with the plurality of gate structures 104 (106/108). The integrated circuit structure 150 also includes a plurality of dielectric spacers 112. A corresponding one of the plurality of dielectric spacers 112 is between adjacent ones of the plurality of gate structures 104 (106/108) and the plurality of conductive trench contact structures 110. The plurality of dielectric spacers 112 protrudes above the plurality of gate structures 104 (106/108) and above the plurality of conductive trench contact structures 110. A dielectric liner 114A is over the plurality of gate structures 104 (106/108), over the plurality of conductive trench contact structures 110, and over the plurality of dielectric spacers 112. An interlayer dielectric material 116B is over the dielectric liner 114A. An opening is in the interlayer dielectric material 116B and in the dielectric liner 114A, the opening exposing one of the plurality of gate structures 104 (106/108). A conductive structure 120A or 120B is in the opening. The conductive structure 120A or 120B is in direct contact with the one of the plurality of gate structures 104 (106/108).

In one embodiment, the opening exposes a portion of one of the plurality of dielectric spacers 112. In one embodiment, a portion 122A or 122B of the conductive structure 120A or 120B, respectively, is vertically beneath the interlayer dielectric material 116B. In one embodiment, the conductive structure 120A or 120B has an uppermost surface co-planar with an uppermost surface of the interlayer dielectric material 116B, as is depicted. In one embodiment, the dielectric liner 114A includes aluminum and oxygen, and the sidewall spacers include silicon and nitrogen.

In another aspect, a grating assisted gate spacer aligned contact approach is implemented. Embodiments described herein can be implemented to increase a via contact (VCx) process margin in both X and Y directions, e.g., a spacer aligned contact approach portion and a grating assistance portion for VCx landing. Implementation of embodiments described herein may be detectable by the presence of via edges that are flat in a gate to contact direction indicating alignment to a grating. Implementation of embodiments described herein may be detectable by the presence of source/drain (S/D) and gate having a same inter-layer dielectric (ILD) stack there over, indicating the use of a single process to generate a S/D via and a gate via. Implementation of embodiments described herein may be detectable by the presence of a source/drain (S/D) and gate recessed below a gate spacer. Implementation of embodiments described herein may be detectable by the presence of a liner that wraps around the spacer and that sticks out above a gate and S/D.

In an exemplary processing scheme using grating alignment, FIGS. 2A-2E illustrate angled cross-sectional views illustrating various operations in a method of fabricating a spacer self-aligned via structures using assisted grating for gate and/or trench contact, in accordance with an embodiment of the present disclosure.

Figure 2A:
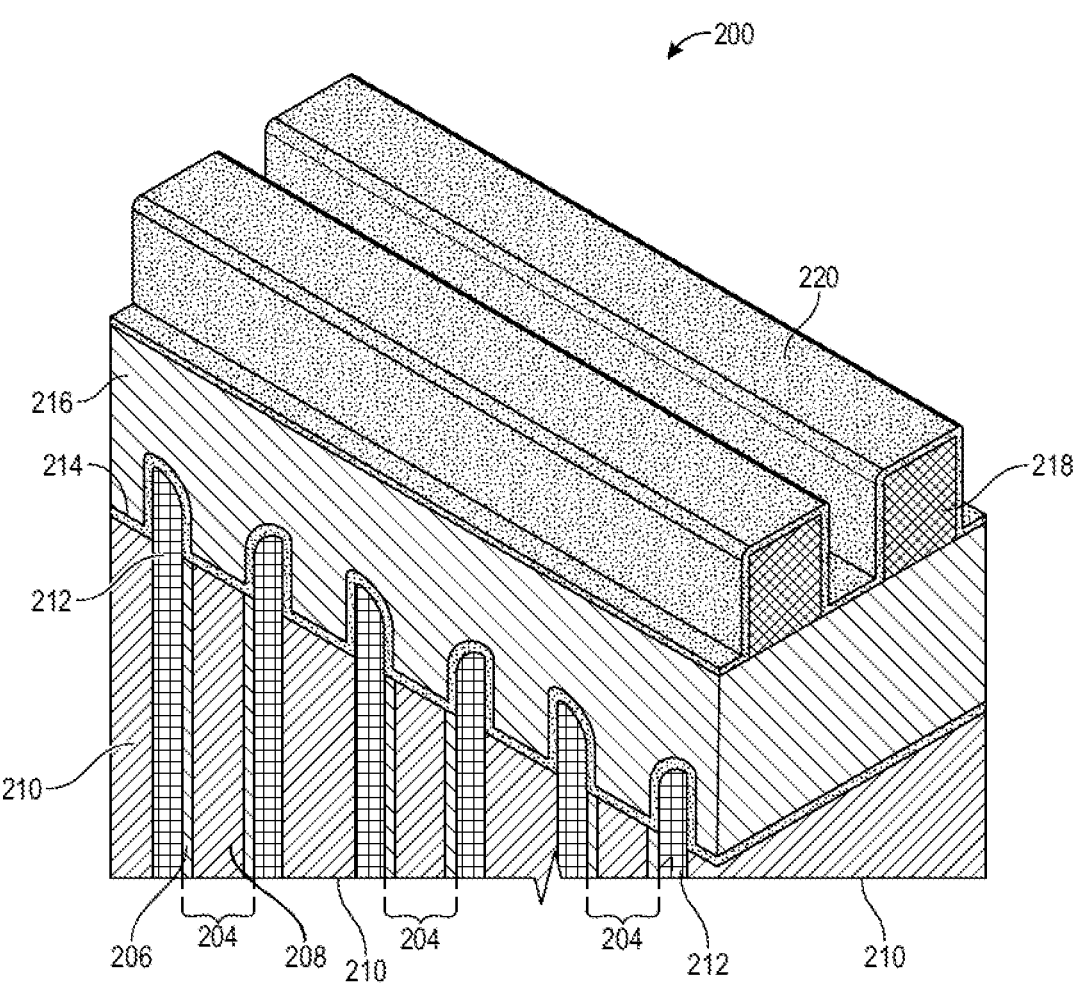
FIGS. 2A-2E illustrate angled cross-sectional views illustrating various operations in a method of fabricating a spacer self-aligned via structures using assisted grating for gate and/or trench contact, in accordance with an embodiment of the present disclosure.

Referring to FIG. 2A, a starting structure 200 includes a plurality of gate structures 204 above a substrate (not shown). The gate structures 204 can each include a gate electrode 208 and a gate dielectric 206. Dielectric spacers 212, such as spacers composed of SiONC, SiON or SiNC, are formed along sides of the gate structures 204. Conductive trench contact structures 210 are between the dielectric spacers 212 of adjacent gate structures 204. The conductive trench contact structures 210 and the gate structures 204 are recessed relative to the dielectric spacers 212. In one embodiment, the recessed conductive trench contact structures 210 and the gate structures 204 have a top surface co-planar with one another, as is depicted. In another embodiment, the conductive trench contact structures 210 have a top surface above the top surface of the gate structures 204. In another embodiment, the conductive trench contact structures 210 have a top surface below the top surface of the gate structures 204. In one embodiment, the dielectric spacers 212 protrude about 15 nm above the conductive trench contact structures 210 and the gate structures 204.

Referring again to FIG. 2A, a dielectric liner 214 is formed conformally on the above described features. In an embodiment, the dielectric liner 214 is composed of aluminum oxide, $Al_2O_3$ (or, alternatively, SiCN, SiON, TiN, SiO, etc.) In an embodiment, the dielectric liner 214 is formed using atomic layer deposition (ALD). In an embodiment, the dielectric liner 214 has a thickness of about 5 nm. An interlayer dielectric layer 216 is formed on the dielectric liner 214. In one embodiment, the interlayer dielectric layer 216 is composed of SiOC or $SiO_2$.

Referring again to FIG. 2A, a grating structure 218 is formed over the interlayer dielectric layer 216. Lines of the grating structure 218 are in a direction orthogonal to the lengthwise direction of the conductive trench contact structures 210 and the gate structures 204. In one embodiment, lines of the grating structure 218 are compose of silicon nitride, silicon carbide, or amorphous carbon. A liner 220 is formed over the grating structure 218. In one embodiment, the liner 220 is composed of $Al_2O_3$, SiCN, SiON, TiN, or SiO.)

Figure 2B:
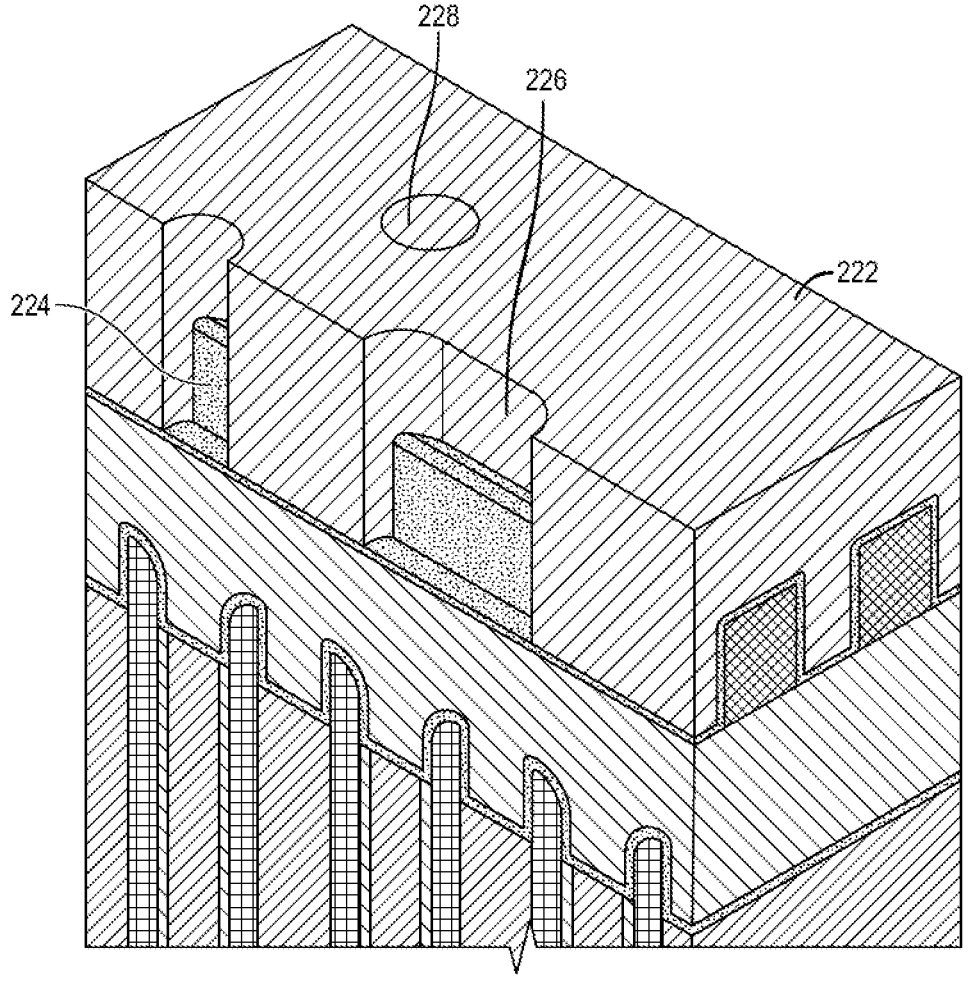

Referring to FIG. 2B, a patterning layer or stack of layers 222 is formed over the structure of FIG. 2A. Openings are formed in the patterning layer or stack of layers 222, e.g., by a lithography process. In the exemplary embodiments shown, three different types of openings are formed: a via contact to gate (VCG) opening 224, a gate to contact (GCN) opening 226, and a via to contact (VCT) opening 228. In one embodiment, the openings 224, 226 and 228 are formed in different process operations, e.g., using an accumulation patterning process. In another embodiment, all openings 224, 226 and 228 are formed during a same process operation.

Figure 2C:
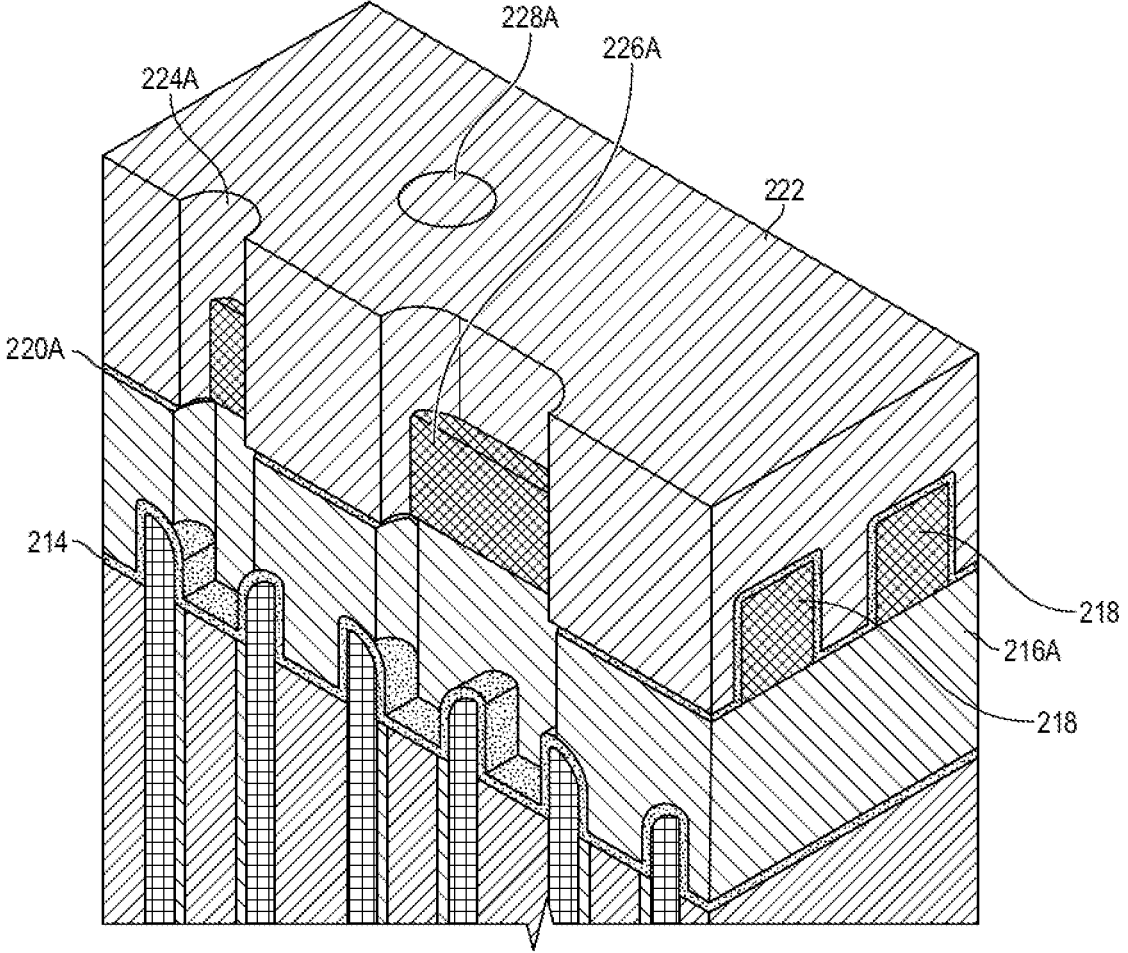

Referring to FIG. 2C, the openings 224, 226 and 228 are used to guide an etch process of the structure of FIG. 2B to pattern the liner 220 and the interlayer dielectric layer 216 to form patterned liner 220A and patterned interlayer dielectric layer 216A. The openings 224, 226 and 228 are extended to form corresponding openings 224A, 226A and 228A, respectively. In one embodiment, the etch process lands on the liner 214, as is depicted. In an embodiment, the grating structure 218 confines the etch process to regions between individual lines of the grating structure 218, as is depicted.

Figure 2D:
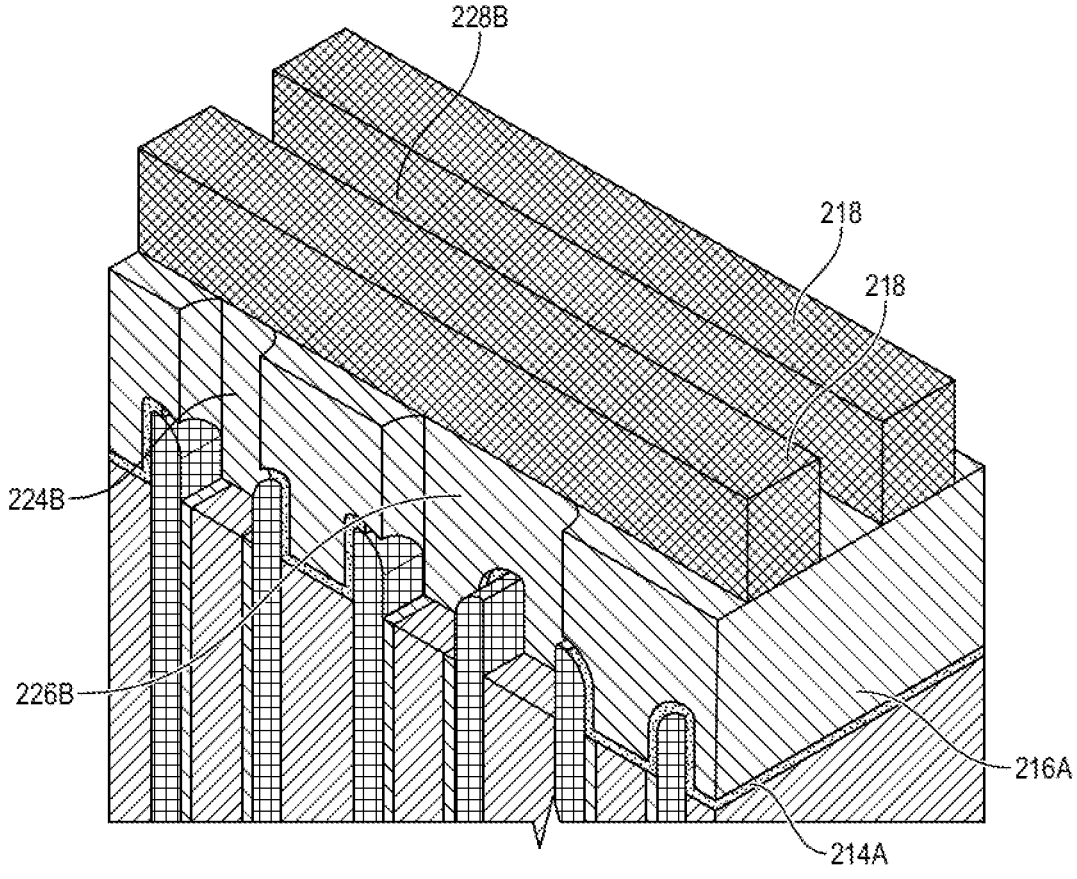

Referring to FIG. 2D, the openings 224A, 226A and 228A of FIG. 2C are used as a guide to etch liner 214 to form patterned liner 214A. Patterning liner 214 to form patterned liner 214A exposes corresponding portions of conductive trench contact structures 210 and/or gate structures 204 beneath the openings 224A, 226A and 228A. The patterned line 220A and the patterning layer or stack of layers 222 are removed from the structure of FIG. 2C. Following the processing, openings 224B, 226B and 228B remain corresponding to openings 224A, 226A and 228A, respectively. In one embodiment, patterning liner 214 to form patterned liner 214A leaves patterned liner partially recessed vertically beneath the patterned interlayer dielectric layer 216A, as is depicted.

Figure 2E:
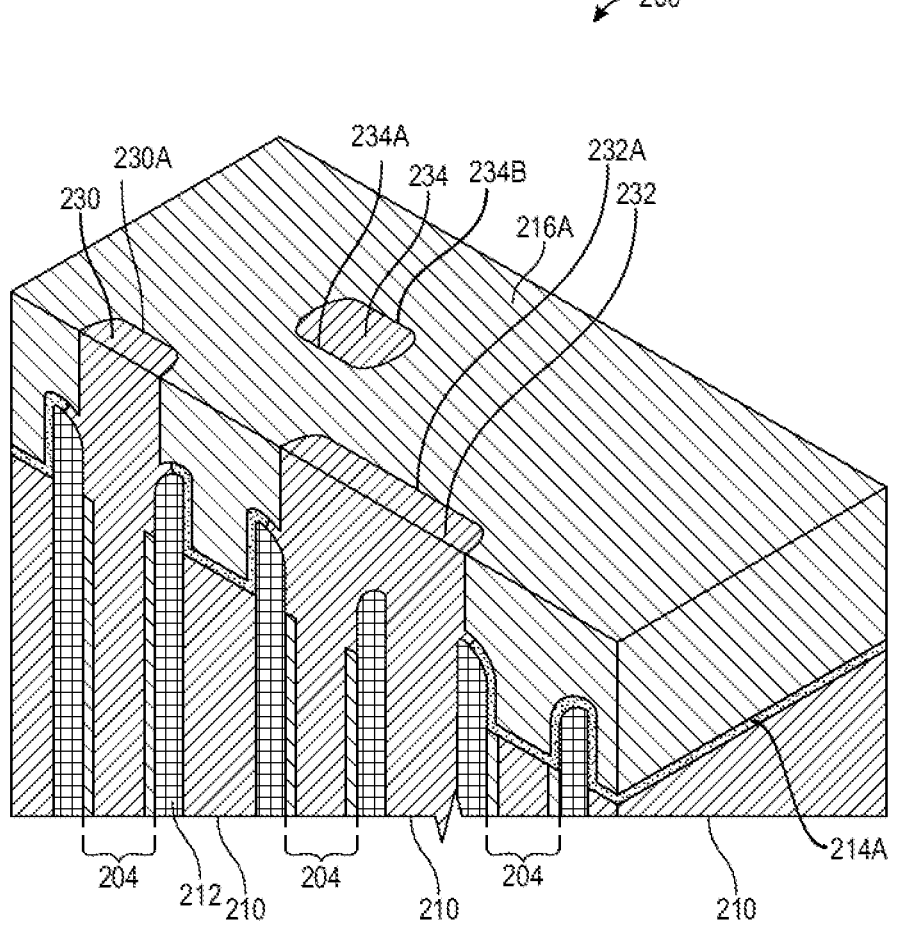

Referring to FIG. 2E, a conductive material is formed over the structure of FIG. 2D and can planarized to form conductive structures 230, 232 and 234 in openings 224B, 226B and 228B, respectively. In one embodiment, conductive structure 230 is a via contact to gate (VCG) conductive structure. In one embodiment, conductive structure 232 is a gate to contact (GCN) conductive structure. In one embodiment, conductive structure 234 is a via to contact (VCT) conductive structure. In an embodiment, a structure fabricated generally according to the above scheme can include conductive structure 230, or conductive structure 232, or conductive structure 234, or conductive structure 230 and conductive structure 232, or conductive structure 230 and conductive structure 234, or conductive structure 232 and conductive structure 234, or conductive structure 230 and conductive structure 232 and conductive structure 234.

Referring again to FIG. 2E, one or more of the conductive structures 230, 232 and 234 can have features that are vertically beneath the patterned interlayer dielectric layer 216A, e.g., where patterned liner 214A is partially recessed vertically beneath the patterned interlayer dielectric layer 216A, as is depicted. In an embodiment, the conductive structures 230, 232 and 234 include a same conductive fill as the underlying gate structure 204 and/or the underlying conductive trench contact structures 210 and, effectively, can form a unitary structure with the underlying gate structure 204 and/or the underlying conductive trench contact structures 210, as is depicted. In other embodiments, a liner and a fill are used to form conductive structures 230, 232 and 234. It is to be appreciated that a patterned conductive liner 214A can be present in a completed product.

Referring again to FIG. 2E, one or more of the conductive structures 230, 232 and 234 can have a flat edge (e.g., 230A, 232A, 234A, or 234B) which can be as a result of using the grating structure 218 for patterning. In one embodiment, a conductive structure has a flat edge along a direction across one of the plurality of gate structures 204, e.g. as is depicted for conductive structures 230 and 232. In one embodiment, a conductive structure has a flat edge along a direction across one of the plurality of conductive trench contact structures 210, e.g. as is depicted for conductive structures 234 and 232. In an embodiment, a "flat" edge is used to describe an edge that is perfectly flat. In an embodiment, a "flat" edge is used to describe an edge that is essentially flat. In an embodiment, a "flat" edge is used to describe an edge that is substantially flat. A flat edge can be an edge with absolutely no curvature or with very slight curvature, and is in stark contrast to an edge of a circular or oval shaped via structure, such as a structure formed in a patterning process absent a grating assisted approach.

With reference again to FIG. 2E, in accordance with an embodiment of the present disclosure, an integrated circuit structure 250 includes a plurality of gate structures 204 (206/208) above a substrate (not depicted). A plurality of conductive trench contact structures 210 is alternating with the plurality of gate structures 204 (206/208). The integrated circuit structure 250 also includes a plurality of dielectric spacers 212. A corresponding one of the plurality of dielectric spacers 212 is between adjacent ones of the plurality of gate structures 204 (206/208) and the plurality of conductive trench contact structures 210. The plurality of dielectric spacers 212 protrudes above the plurality of gate structures 204 (206/208) and above the plurality of conductive trench contact structures 210. A dielectric liner 214A is over the plurality of gate structures 204 (206/208), over the plurality of conductive trench contact structures 210, and over the plurality of dielectric spacers 212. An interlayer dielectric material 216A is over the dielectric liner 214A. An opening is in the interlayer dielectric material 216A and in the dielectric liner 214A, the opening exposing one of the plurality of gate structures 204 (206/208). A conductive structure 230 or 232 is in the opening. The conductive structure 230 or 232 is in direct contact with the one of the plurality of gate structures 204 (206/208). In one embodiment, the conductive structure 230 or 232 has a flat edge along a direction across the one of the plurality of gate structures 204. In one embodiment, the conductive structure is in direct contact with the one of the plurality of gate structures 204 but not with a conductive trench contact structure 210, such as conductive structure 230. In one embodiment, the conductive structure is in direct contact with the one of the plurality of gate structures 204 and with a conductive trench contact structure 210, such as conductive structure 232.

In one embodiment, the opening exposes a portion of one of the plurality of dielectric spacers 212. In one embodiment, a portion of the conductive structure 230 or 232 is vertically beneath the interlayer dielectric material 216A. In one embodiment, the conductive structure 230 or 232 has an uppermost surface co-planar with an uppermost surface of the interlayer dielectric material 216A, as is depicted. In one embodiment, the dielectric liner 214A includes aluminum and oxygen, and the sidewall spacers include silicon and nitrogen.

With reference again to FIG. 2E, in accordance with an embodiment of the present disclosure, an integrated circuit structure 250 includes a plurality of gate structures 204 (206/208) above a substrate (not depicted). A plurality of conductive trench contact structures 210 is alternating with the plurality of gate structures 204 (206/208). The integrated circuit structure 250 also includes a plurality of dielectric spacers 212. A corresponding one of the plurality of dielectric spacers 212 is between adjacent ones of the plurality of gate structures 204 (206/208) and the plurality of conductive trench contact structures 210. The plurality of dielectric spacers 212 protrudes above the plurality of gate structures 204 (206/208) and above the plurality of conductive trench contact structures 210. A dielectric liner 214A is over the plurality of gate structures 204 (206/208), over the plurality of conductive trench contact structures 210, and over the plurality of dielectric spacers 212. An interlayer dielectric material 216A is over the dielectric liner 214A. An opening is in the interlayer dielectric material 216A and in the dielectric liner 214A, the opening exposing one of the plurality of conductive trench contact structures 210. A conductive structure 234 or 232 is in the opening. The conductive structure 234 or 232 is in direct contact with the one of the plurality of conductive trench contact structures 210. In one embodiment, the conductive structure 234 or 232 has a flat edge along a direction across the one of the plurality of conductive trench contact structures 210. In one embodiment, the conductive structure is in direct contact with the one of the plurality of conductive trench contact structures 210 but not with a gate structure 204, such as conductive structure 234. In one embodiment, the conductive structure is in direct contact with the one of the plurality of conductive trench contact structures 210 and with a gate structure 204, such as conductive structure 232.

In one embodiment, the opening exposes a portion of one of the plurality of dielectric spacers 212. In one embodiment, a portion of the conductive structure 234 or 232 is vertically beneath the interlayer dielectric material 216A, as is depicted for 232. In one embodiment, the conductive structure 234 or 232 has an uppermost surface co-planar with an uppermost surface of the interlayer dielectric material 216A, as is depicted. In one embodiment, the dielectric liner 214A includes aluminum and oxygen, and the sidewall spacers include silicon and nitrogen.

To provide further background for the importance of a COAG processing scheme, in technologies where space and layout constraints are somewhat relaxed compared with current generation space and layout constraints, a contact to gate structure may be fabricated by making contact to a portion of the gate electrode disposed over an isolation region. As an example, FIG. 3A illustrates a plan view of a semiconductor device having a gate contact disposed over an inactive portion of a gate electrode.

Figures 3A, 4A:
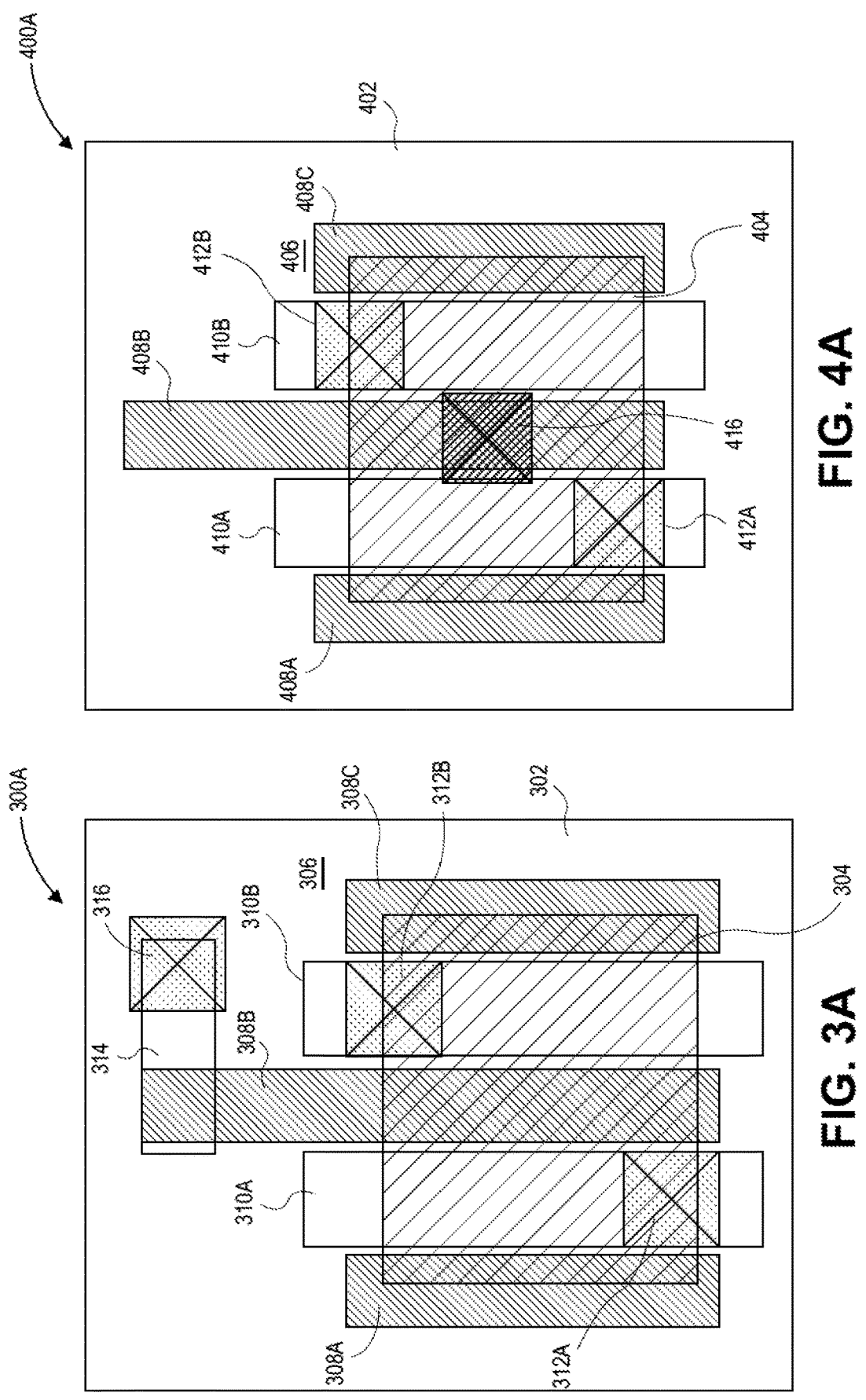
FIG. 3A illustrates a plan view of a semiconductor device having a gate contact disposed over an inactive portion of a gate electrode.
FIG. 4A illustrates a plan view of a semiconductor device having a gate contact via disposed over an active portion of a gate electrode, in accordance with an embodiment of the present disclosure.

Referring to FIG. 3A, a semiconductor structure or device 300A includes a diffusion or active region 304 disposed in a substrate 302, and within an isolation region 306. One or more gate lines (also known as poly lines), such as gate lines 308A, 308B and 308C are disposed over the diffusion or active region 304 as well as over a portion of the isolation region 306. Source or drain contacts (also known as trench contacts), such as contacts 310A and 310B, are disposed over source and drain regions of the semiconductor structure or device 300A. Trench contact vias 312A and 312B provide contact to trench contacts 310A and 310B, respectively. A separate gate contact 314, and overlying gate contact via 316, provides contact to gate line 308B. In contrast to the source or drain trench contacts 310A or 310B, the gate contact 314 is disposed, from a plan view perspective, over isolation region 306, but not over diffusion or active region 304. Furthermore, neither the gate contact 314 nor gate contact via 316 is disposed between the source or drain trench contacts 310A and 310B.

Figures 3B, 4B:
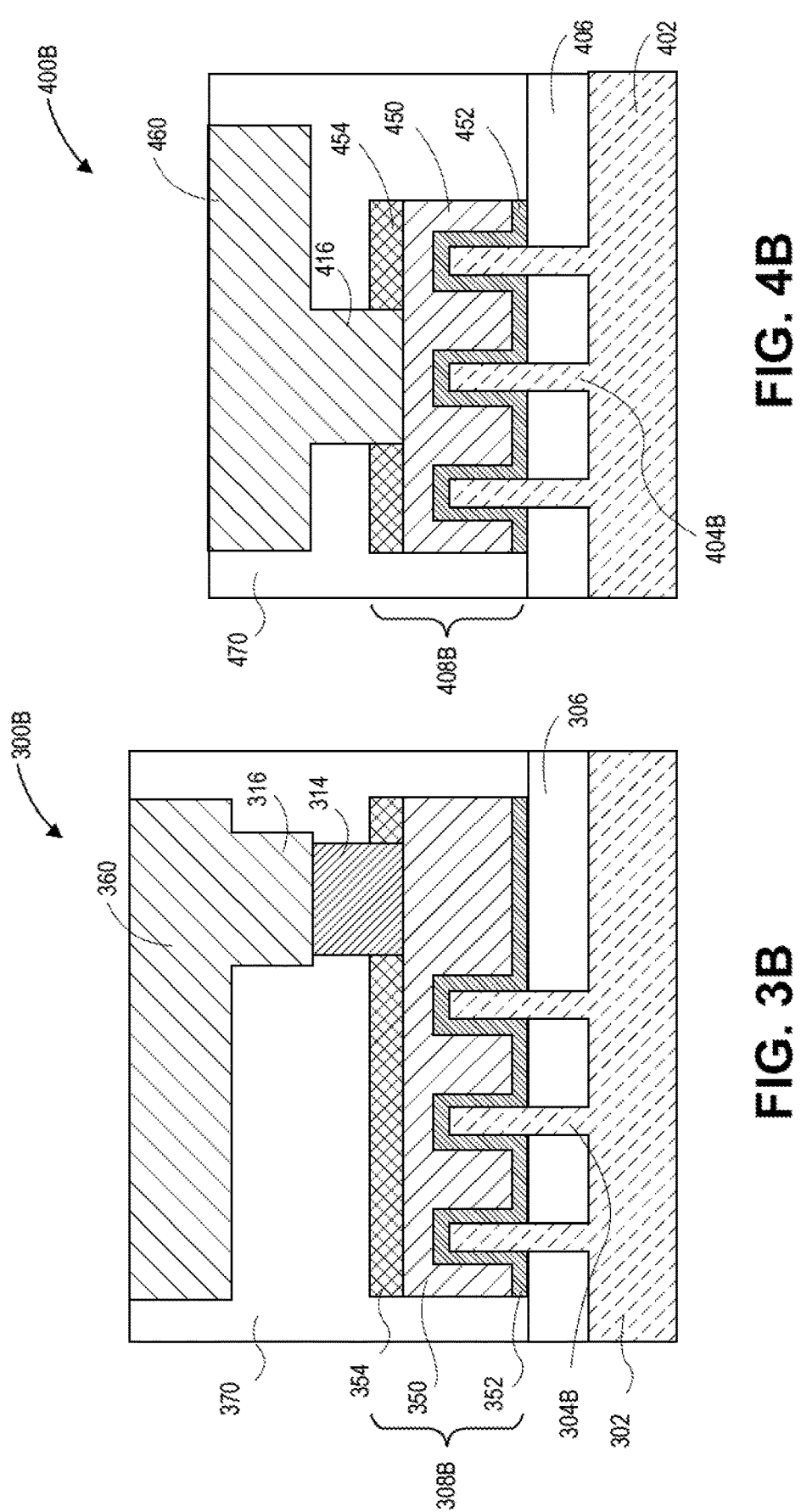
FIG. 3B illustrates a cross-sectional view of a non-planar semiconductor device having a gate contact disposed over an inactive portion of a gate electrode.
FIG. 4B illustrates a cross-sectional view of a non-planar semiconductor device having a gate contact via disposed over an active portion of a gate electrode, in accordance with an embodiment of the present disclosure.

FIG. 3B illustrates a cross-sectional view of a non-planar semiconductor device having a gate contact disposed over an inactive portion of a gate electrode. Referring to FIG. 3B, a semiconductor structure or device 300B, e.g. a non-planar version of device 300A of FIG. 3A, includes a non-planar diffusion or active region 304B (e.g., a fin structure) formed from substrate 302, and within isolation region 306. Gate line 308B is disposed over the non-planar diffusion or active region 304B as well as over a portion of the isolation region 306. As shown, gate line 308B includes a gate electrode 350 and gate dielectric layer 352, along with a dielectric cap layer 354. Gate contact 314, and overlying gate contact via 316 are also seen from this perspective, along with an overlying metal interconnect 360, all of which are disposed in inter-layer dielectric stacks or layers 370. Also seen from the perspective of FIG. 3B, the gate contact 314 is disposed over isolation region 306, but not over non-planar diffusion or active region 304B.

Referring again to FIGS. 3A and 3B, the arrangement of semiconductor structure or device 300A and 300B, respectively, places the gate contact over isolation regions. Such an arrangement wastes layout space. However, placing the gate contact over active regions would require either an extremely tight registration budget or gate dimensions would have to increase to provide enough space to land the gate contact. Furthermore, historically, contact to gate over diffusion regions has been avoided for risk of drilling through other gate material (e.g., polysilicon) and contacting the underlying active region. One or more embodiments described herein address the above issues by providing feasible approaches, and the resulting structures, to fabricating contact structures that contact portions of a gate electrode formed over a diffusion or active region.

As an example, FIG. 4A illustrates a plan view of a semiconductor device having a gate contact via disposed over an active portion of a gate electrode, in accordance with an embodiment of the present disclosure. Referring to FIG. 4A, a semiconductor structure or device 400A includes a diffusion or active region 404 disposed in a substrate 402, and within an isolation region 406. One or more gate lines, such as gate lines 408A, 408B and 408C are disposed over the diffusion or active region 404 as well as over a portion of the isolation region 406. Source or drain trench contacts, such as trench contacts 410A and 410B, are disposed over source and drain regions of the semiconductor structure or device 400A. Trench contact vias 412A and 412B provide contact to trench contacts 410A and 410B, respectively. A gate contact via 416, with no intervening separate gate contact layer, provides contact to gate line 408B. In contrast to FIG. 3A, the gate contact 416 is disposed, from a plan view perspective, over the diffusion or active region 404 and between the source or drain contacts 410A and 410B.

FIG. 4B illustrates a cross-sectional view of a non-planar semiconductor device having a gate contact via disposed over an active portion of a gate electrode, in accordance with an embodiment of the present disclosure. Referring to FIG. 4B, a semiconductor structure or device 400B, e.g. a non-planar version of device 400A of FIG. 4A, includes a non-planar diffusion or active region 404B (e.g., a fin structure) formed from substrate 402, and within isolation region 406. Gate line 408B is disposed over the non-planar diffusion or active region 404B as well as over a portion of the isolation region 406. As shown, gate line 408B includes a gate electrode 450 and gate dielectric layer 452, along with a dielectric cap layer 454. The gate contact via 416 is also seen from this perspective, along with an overlying metal interconnect 460, both of which are disposed in inter-layer dielectric stacks or layers 470. Also seen from the perspective of FIG. 4B, the gate contact via 416 is disposed over non-planar diffusion or active region 404B.

Thus, referring again to FIGS. 4A and 4B, in an embodiment, trench contact vias 412A, 412B and gate contact via 416 are formed in a same layer and are essentially co-planar. In comparison to FIGS. 3A and 3B, the contact to the gate line would otherwise include and additional gate contact layer, e.g., which could be run perpendicular to the corresponding gate line. In the structure(s) described in association with FIGS. 4A and 4B, however, the fabrication of structures 400A and 400B, respectively, enables the landing of a contact directly from a metal interconnect layer on an active gate portion without shorting to adjacent source drain regions. In an embodiment, such an arrangement provides a large area reduction in circuit layout by eliminating the need to extend transistor gates on isolation to form a reliable contact. As used throughout, in an embodiment, reference to an active portion of a gate refers to that portion of a gate line or structure disposed over (from a plan view perspective) an active or diffusion region of an underlying substrate. In an embodiment, reference to an inactive portion of a gate refers to that portion of a gate line or structure disposed over (from a plan view perspective) an isolation region of an underlying substrate.

In an embodiment, the semiconductor structure or device 400 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 408A and 408B surround at least a top surface and a pair of sidewalls of the three-dimensional body. In another embodiment, at least the channel region is made to be a discrete three-dimensional body, such as in a gate-all-around device. In one such embodiment, the gate electrode stacks of gate lines 408A and 408B each completely surrounds the channel region.

Generally, one or more embodiments are directed to approaches for, and structures formed from, landing a gate contact via directly on an active transistor gate. Such approaches may eliminate the need for extension of a gate line on isolation for contact purposes. Such approaches may also eliminate the need for a separate gate contact (GCN) layer to conduct signals from a gate line or structure. In an embodiment, eliminating the above features is achieved by recessing contact metals in a trench contact (TCN) and recessing gate structure materials, and introducing an additional dielectric liner in the process flow.

To provide further context, some implementations of COAG impose tight controls on multiple modules such as gate and contact recess, dielectric hard masks deposition, and dielectric polish to ensure uniformity of the etch selective ("colored") hardmasks and strict adherence of the hardmask thickness to specifications. Limited etch selectivity of the color etches may leave little room for any upstream process deviations typical of a manufacturing line. The COAG implementations may not provide a robust process window that eliminates all opens and shorts.

In accordance with one or more embodiments of the present disclosure, a process flow is implemented which involves recessing the gates and trench contacts (TCNs) between spacers to enable an increase in edge placement error margin and enable contacts over active gates. The process can enable the fabrication of contacts over active gates for device scaling. It is to be appreciated that, in contrast to the above description, gate structures may have a cap thereon that is removed to enable the above described processes. As an exemplary processing scheme, FIGS. 5A-5D illustrate cross-sectional views illustrating various operations in a method of fabricating a contact over active gate (COAG) structure having a gate contact or trench contact, in accordance with an embodiment of the present disclosure.

Figure 5A:
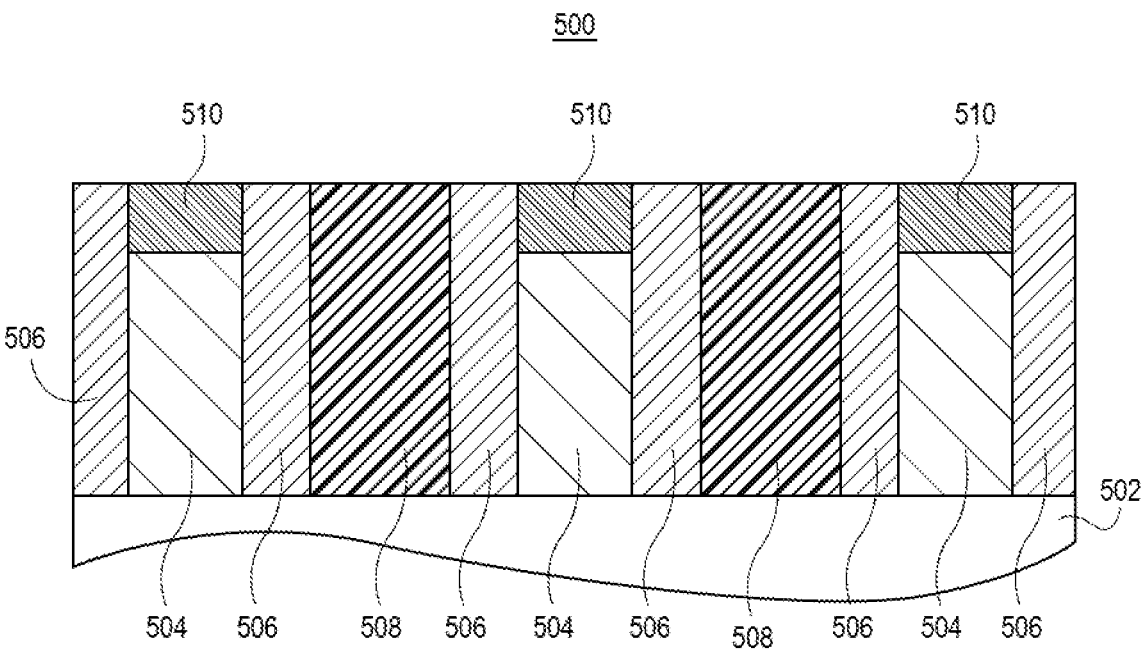
FIGS. 5A-5D illustrate cross-sectional views illustrating various operations in a method of fabricating a contact over active gate (COAG) structure having a gate contact or trench contact, in accordance with an embodiment of the present disclosure.

Referring to FIG. 5A, a starting structure 500 includes a plurality of gate structures 504 above a substrate 502. The gate structures 504 can each include a gate electrode and a gate dielectric. In the case that the gate structures 504 are recessed, a gate insulating cap layer 510 is on each of the gate structures 504, as is depicted. Dielectric spacers 506 (e.g., carbon-doped silicon oxide (SiOC) spacers or SiOCN spacers) are formed along sides of the gate structures 504. Conductive trench contact structures 508 are between the dielectric spacers 506 of adjacent gate structures 504.

Figure 5B:
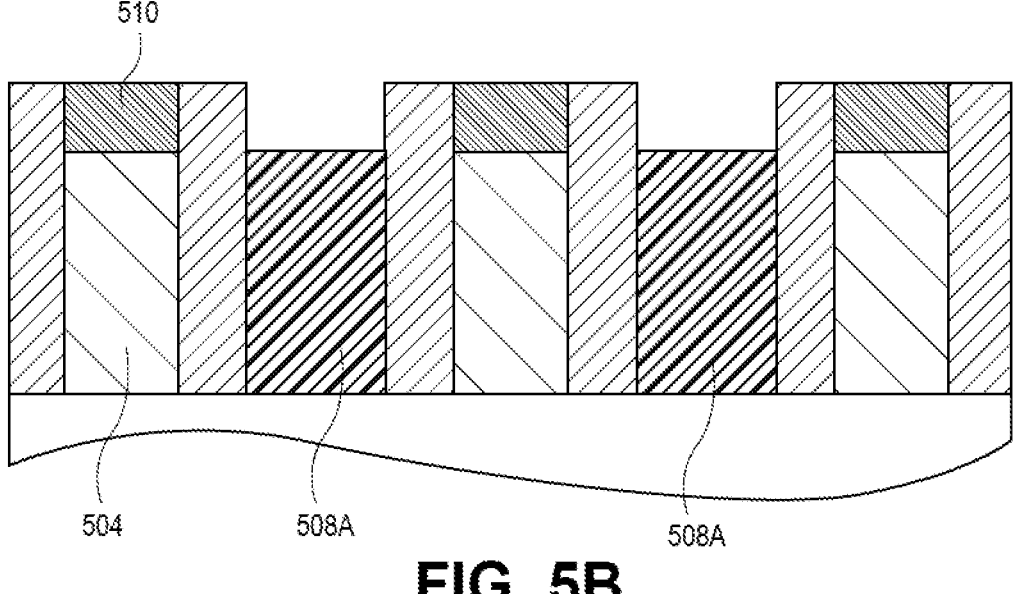

Referring to FIG. 5B, the conductive trench contact structures 508 are recessed to form conductive trench contact structures 508A. In one embodiment, the conductive trench contact structures 508 are recessed to form conductive trench contact structures 508A having a top surface co-planar with the top surface of the gate structures 504, as is depicted. In another embodiment, the conductive trench contact structures 508 are recessed to form conductive trench contact structures 508A having a top surface above the top surface of the gate structures 504. In another embodiment, the conductive trench contact structures 508 are recessed to form conductive trench contact structures 508A having a top surface below the top surface of the gate structures 504. In an embodiment, the conductive trench contact structures 508A include tungsten.

Figure 5C:
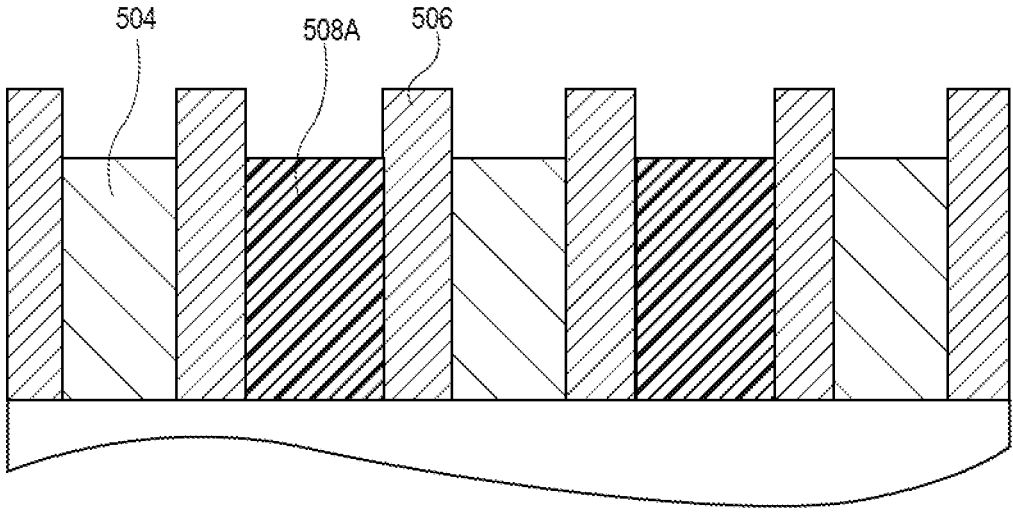

Referring to FIG. 5C, the gate insulating cap layer 510 are removed from the structure of FIG. 5B.

Figure 5D:
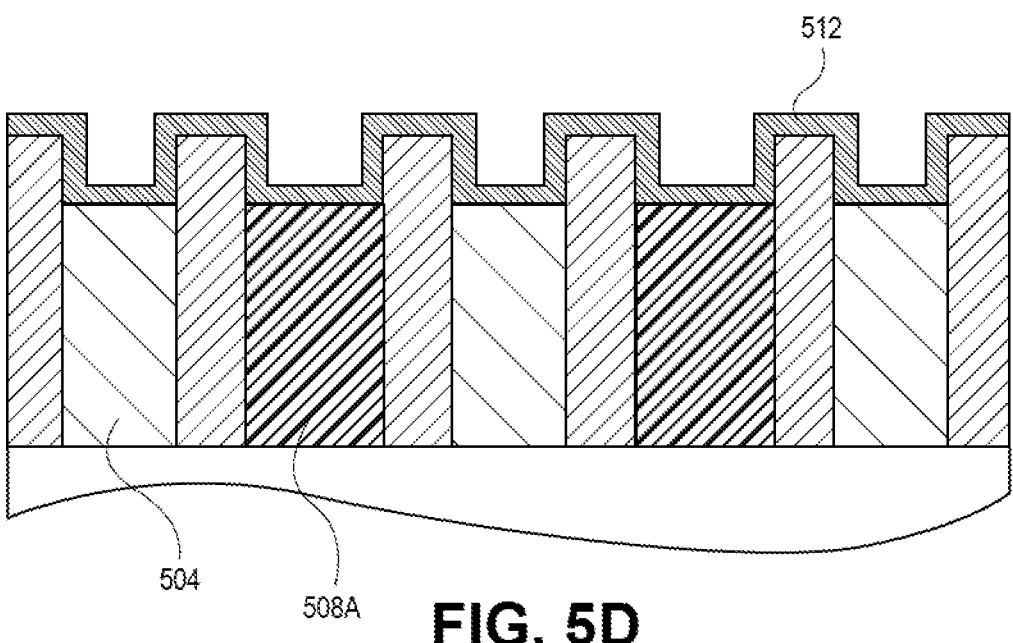

Referring to FIG. 5D, a dielectric liner 512 is formed conformally on the structure of FIG. 5C. In an embodiment, the dielectric liner 512 is composed of aluminum oxide, $Al_2O_3$. In an embodiment, the dielectric liner 512 is formed using atomic layer deposition (ALD). The structure of FIG. 5D can then be used to form a trench contact and/or a gate contact (such as described above in association with FIGS. 1A-1E and/or 2A-2E).

As an exemplary fabrication scheme, a starting structure includes one or more gate stack structures disposed above a substrate. The gate stack structures may include a gate dielectric layer and a gate electrode. Trench contacts, e.g., contacts to diffusion regions of the substrate or to epitaxial region formed within the substrate are spaced apart from gate stack structures by dielectric spacers. In an embodiment, the contact pattern is essentially perfectly aligned to an existing gate pattern while eliminating the use of a lithographic operation with exceedingly tight registration budget. In one such embodiment, this approach enables the use of intrinsically highly selective wet etching (or anisotropic dry etch processes some of which are non-plasma, gas phase isotropic etches (e.g., versus classic dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. This also allows for perfect or near-perfect self-alignment with a larger edge placement error margin. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structures may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including $SF_6$. In another embodiment, dummy gates are composed of polycrystalline silicon or amorphous silicon and are removed with a wet etch process including aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Next, the trench contacts may be recessed to provide recessed trench contacts that have a height below the top surface of adjacent spacers, and the permanent gate structures may be recessed to provide recessed gate structures that have a height below the top surface of the adjacent spacers. An insulating liner is then formed on the recessed trench contacts and recessed gate structures. Gate or trench contacts may then be formed.

Figure 6:
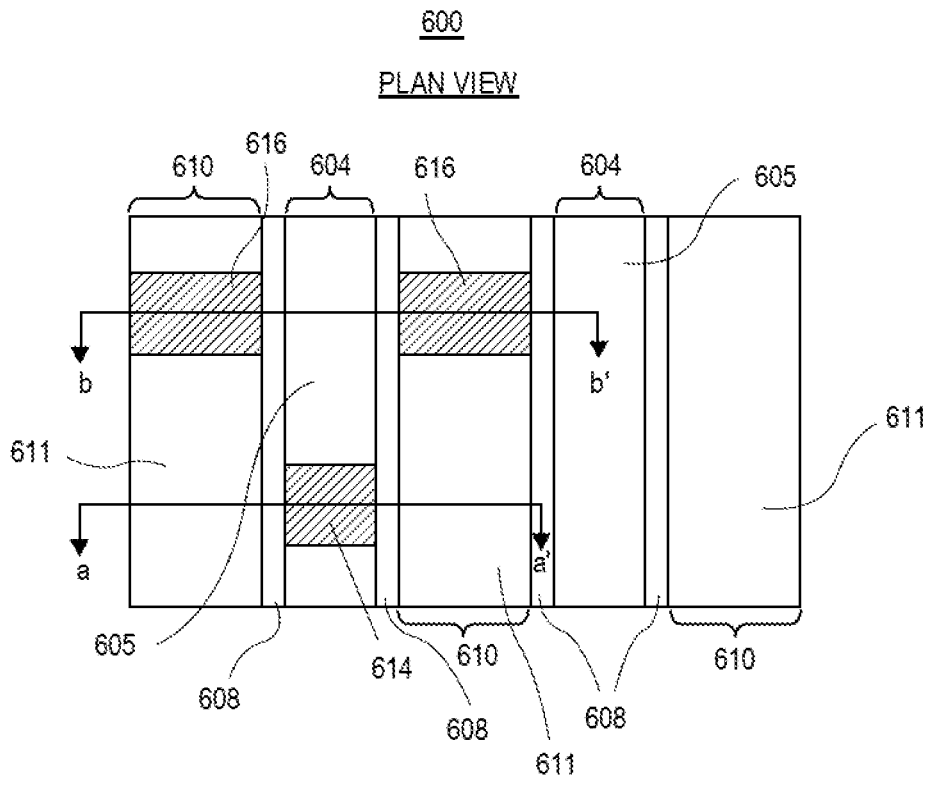
FIG. 6 illustrates a plan view and corresponding cross-sectional views of an integrated circuit structure having trench contacts and a gate contact, in accordance with an embodiment of the present disclosure.
Figure 6:
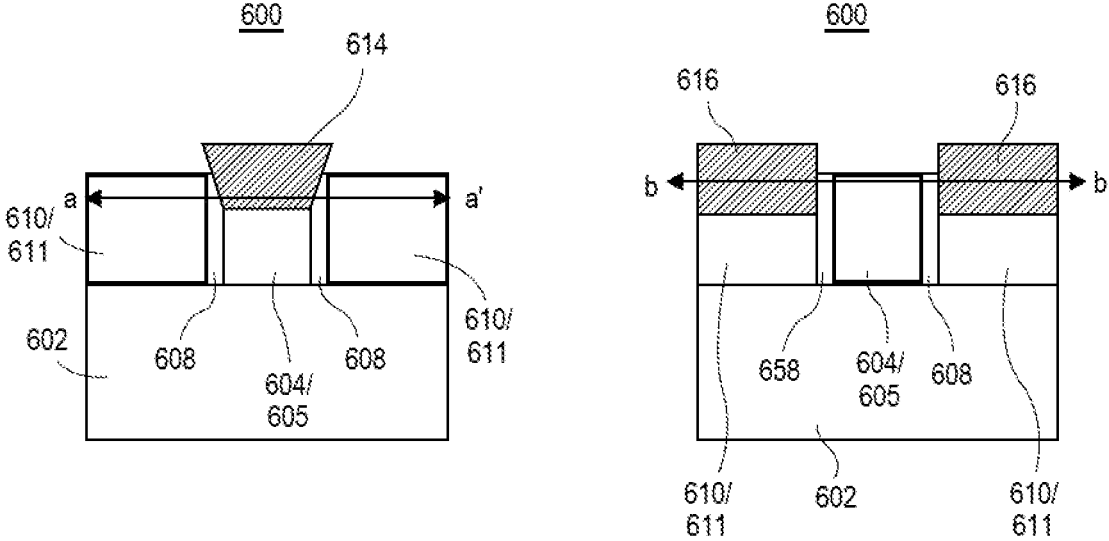

As an exemplary structure showing possible contact layouts, FIG. 6 illustrates a plan view and corresponding cross-sectional views of an integrated circuit structure having trench contacts and a gate contact, in accordance with an embodiment of the present disclosure.

Referring to FIG. 6, an integrated circuit structure 600 includes a gate line 604 above a semiconductor substrate or fin 602, such as a silicon fin. The gate line 604 includes a gate stack 605 (e.g., including a gate dielectric layer or stack and a gate electrode on the gate dielectric layer or stack). Dielectric spacers 608 are along sidewalls of the gate stack 605. Trench contacts 610 are adjacent the sidewalls of the gate line 604, with the dielectric spacers 608 between the gate line 604 and the trench contacts 610. Individual ones of the trench contacts 610 include a conductive contact structure 611.

Referring again to FIG. 6, a gate contact via 614 is formed on a gate stack 605. In an embodiment, the gate contact via 614 electrically contacts the gate stack 605 at a location over the semiconductor substrate or fin 602 and laterally between the trench contacts 610, as is depicted.

Referring again to FIG. 6, trench contact vias 616 electrically contact the respective conductive contact structures 611. In an embodiment, the trench contact vias 616 electrically contact the respective conductive contact structures 611 at locations laterally adjacent the gate stack 605 of the gate line 604, as is depicted.

Figure 7A:
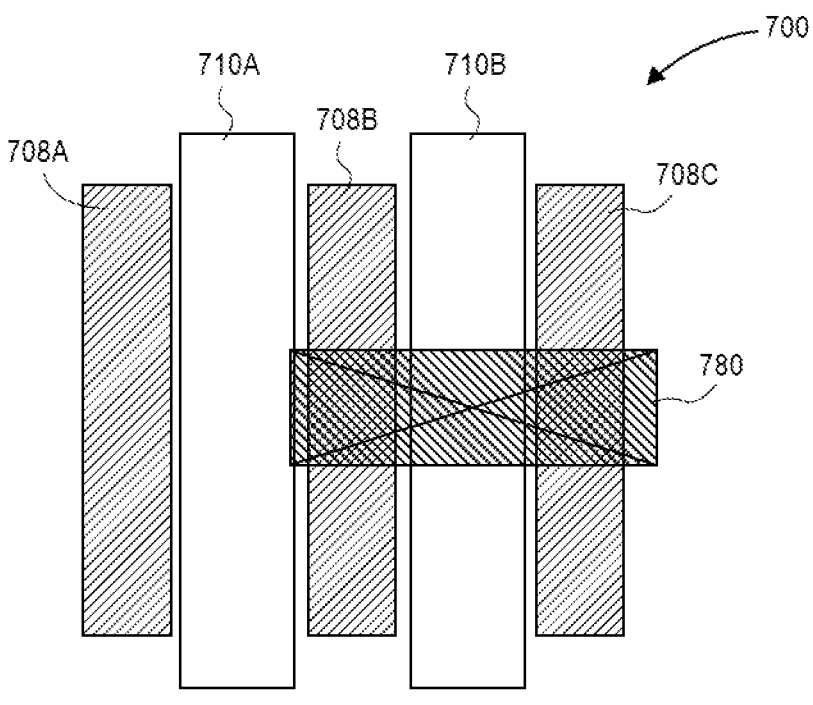
FIG. 7A illustrates a plan view of another semiconductor device having a gate contact via disposed over an active portion of a gate, in accordance with another embodiment of the present disclosure.

The approaches and structures described herein may enable formation of other structures or devices that were not possible or difficult to fabricate using other methodologies. In a first example, FIG. 7A illustrates a plan view of another semiconductor device having a gate contact via disposed over an active portion of a gate, in accordance with another embodiment of the present disclosure. Referring to FIG. 7A, a semiconductor structure or device 700 includes a plurality of gate structures 708A-708C interdigitated with a plurality of trench contacts 710A and 710B (these features are disposed above an active region of a substrate, not shown). A gate contact via 780 is formed on an active portion the gate structure 708B. The gate contact via 780 is further disposed on the active portion of the gate structure 708C, coupling gate structures 708B and 708C. It is to be appreciated that the intervening trench contact 710B may be isolated from the contact via 780 by insulating layers which can include a dielectric liner as described above. The contact configuration of FIG. 7A may provide an easier approach to strapping adjacent gate lines in a layout, hence enabling smaller cell areas or less intricate wiring schemes, or both.

Figure 7B:
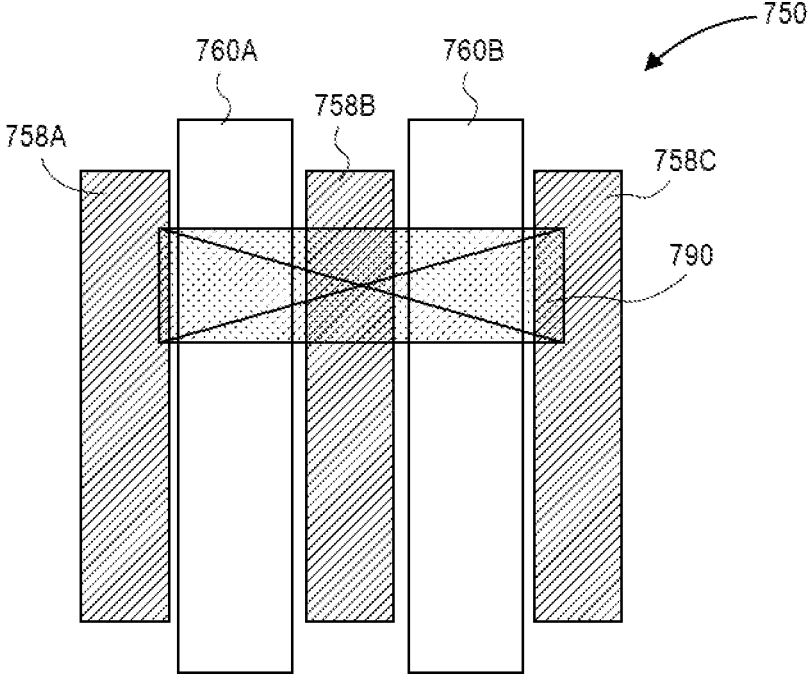
FIG. 7B illustrates a plan view of another semiconductor device having a trench contact via coupling a pair of trench contacts, in accordance with another embodiment of the present disclosure.

In a second example, FIG. 7B illustrates a plan view of another semiconductor device having a trench contact via coupling a pair of trench contacts, in accordance with another embodiment of the present disclosure. Referring to FIG. 7B, a semiconductor structure or device 750 includes a plurality of gate structures 758A-758C interdigitated with a plurality of trench contacts 760A and 760B (these features are disposed above an active region of a substrate, not shown). A trench contact via 790 is formed on the trench contact 760A. The trench contact via 790 is further disposed on the trench contact 760B, coupling trench contacts 760A and 760B. It is to be appreciated that the intervening gate structure 758B may be isolated from the trench contact via 790 by insulating layers which can include a dielectric liner as described above. The contact configuration of FIG. 7B may provide an easier approach to strapping adjacent trench contacts in a layout, hence enabling smaller cell areas or less intricate wiring schemes, or both.

As described throughout the present application, a substrate may be composed of a semiconductor material that can withstand a manufacturing process and in which charge can migrate. In an embodiment, a substrate is described herein is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in such a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a group III-V material and the charge-carrier dopant impurity atoms are ones such as, but not limited to, carbon, silicon, germanium, oxygen, sulfur, selenium or tellurium.

As described throughout the present application, isolation regions such as shallow trench isolation regions or sub-fin isolation regions may be composed of a material suitable to ultimately electrically isolate, or contribute to the isolation of, portions of a permanent gate structure from an underlying bulk substrate or to isolate active regions formed within an underlying bulk substrate, such as isolating fin active regions. For example, in one embodiment, an isolation region is composed of one or more layers of a dielectric material such as, but not limited to, silicon dioxide, silicon oxy-nitride, silicon nitride, carbon-doped silicon nitride, or a combination thereof.

As described throughout the present application, gate lines or gate structures may be composed of a gate electrode stack which includes a gate dielectric layer and a gate electrode layer. In an embodiment, the gate electrode of the gate electrode stack is composed of a metal gate and the gate dielectric layer is composed of a high-k material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of a semiconductor substrate. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, a gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

As described throughout the present application, spacers associated with gate lines or electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

In an embodiment, as is also used throughout the present description, lithographic operations are performed using 193 nm immersion lithography (i193), extreme ultra-violet (EUV) lithography or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In an embodiment, approaches described herein may involve formation of a contact pattern which is very well aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, a gate stack structure may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

In some embodiments, the arrangement of a semiconductor structure or device places a gate contact over portions of a gate line or gate stack over isolation regions. However, such an arrangement may be viewed as inefficient use of layout space. In another embodiment, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, other approaches typically involve an additional lithography process with tight registration of a lithographic contact pattern to an existing gate pattern in combination with selective contact etches. For example, another process may include patterning of a poly (gate) grid with separate patterning of contact features.

It is to be appreciated that pitch division processing and patterning schemes may be implemented to enable embodiments described herein or may be included as part of embodiments described herein. Pitch division patterning typically refers to pitch halving, pitch quartering etc. Pitch division schemes may be applicable to FEOL processing, BEOL processing, or both FEOL (device) and BEOL (metallization) processing. In accordance with one or more embodiments described herein, optical lithography is first implemented to print unidirectional lines (e.g., either strictly unidirectional or predominantly unidirectional) in a predefined pitch. Pitch division processing is then implemented as a technique to increase line density.

In an embodiment, the term "grating structure" for fins, gate lines, metal lines, ILD lines or hardmask lines is used herein to refer to a tight pitch grating structure. In one such embodiment, the tight pitch is not achievable directly through a selected lithography. For example, a pattern based on a selected lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a substantially consistent pitch and having a substantially consistent width. For example, in some embodiments the pitch variation would be within ten percent and the width variation would be within ten percent, and in some embodiments, the pitch variation would be within five percent and the width variation would be within five percent. The pattern may be fabricated by a pitch halving or pitch quartering, or other pitch division, approach. In an embodiment, the grating is not necessarily single pitch.

In an embodiment, a blanket film is patterned using lithography and etch processing which may involve, e.g., spacer-based-double-patterning (SBDP) or pitch halving, or spacer-based-quadruple-patterning (SBQP) or pitch quartering. It is to be appreciated that other pitch division approaches may also be implemented. In any case, in an embodiment, a gridded layout may be fabricated by a selected lithography approach, such as 193 nm immersion lithography ($193i$). Pitch division may be implemented to increase the density of lines in the gridded layout by a factor of n. Gridded layout formation with $193i$ lithography plus pitch division by a factor of 'n' can be designated as $193i$+P/n Pitch Division. In one such embodiment, 193 nm immersion scaling can be extended for many generations with cost effective pitch division.

It is also to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) technology node or sub-10 nanometer (10 nm) technology node. Embodiments described herein can also be implemented for gate all-around (GAA) architectures, such as nanowire or nanoribbon architectures.

Additional or intermediate operations for FEOL layer or structure fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed, or both.

Embodiments disclosed herein may be used to manufacture a wide variety of different types of integrated circuits or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
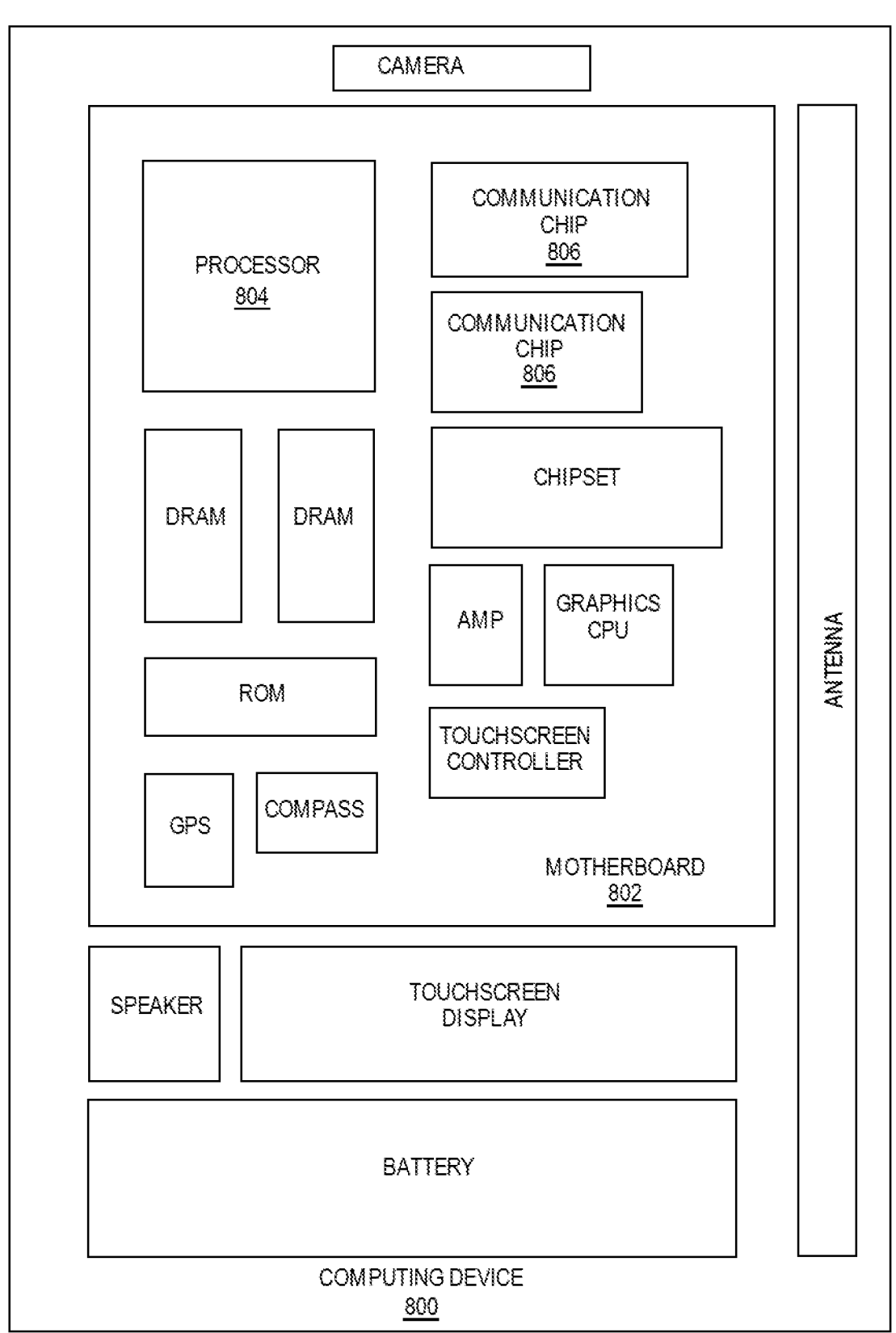
FIG. 8 illustrates a computing device in accordance with one implementation of the disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804.

In some implementations of embodiments of the disclosure, the integrated circuit die of the processor includes one or more structures, such as integrated circuit structures built in accordance with implementations of the disclosure. The term "processor" may refer to any device or portion of a device that processes electronic data from registers or memory to transform that electronic data, or both, into other electronic data that may be stored in registers or memory, or both.

The communication chip 806 also includes an integrated circuit die packaged within the communication chip 806. In accordance with another implementation of the disclosure, the integrated circuit die of the communication chip is built in accordance with implementations of the disclosure.

In further implementations, another component housed within the computing device 800 may contain an integrated circuit die built in accordance with implementations of embodiments of the disclosure.

In various embodiments, the computing device 800 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
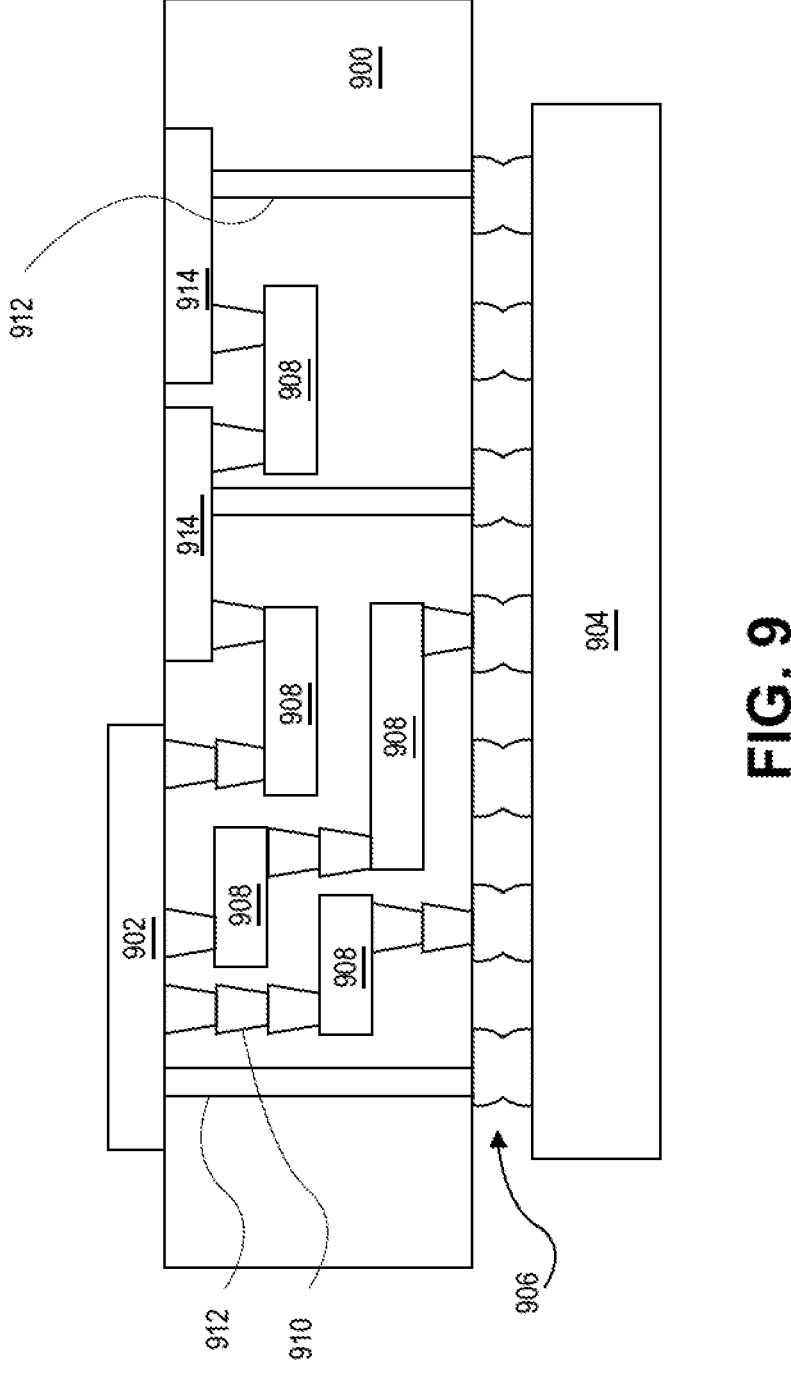
FIG. 9 illustrates an interposer that includes one or more embodiments of the disclosure.

FIG. 9 illustrates an interposer 900 that includes one or more embodiments of the disclosure. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer 900 may be formed of alternate rigid or flexible materials that may include the same materials described above for use in a semiconductor substrate, such as silicon, germanium, and other group III-V and group IV materials.

The interposer 900 may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the disclosure, apparatuses or processes disclosed herein may be used in the fabrication of interposer 900 or in the fabrication of components included in the interposer 900.

Figure 10:
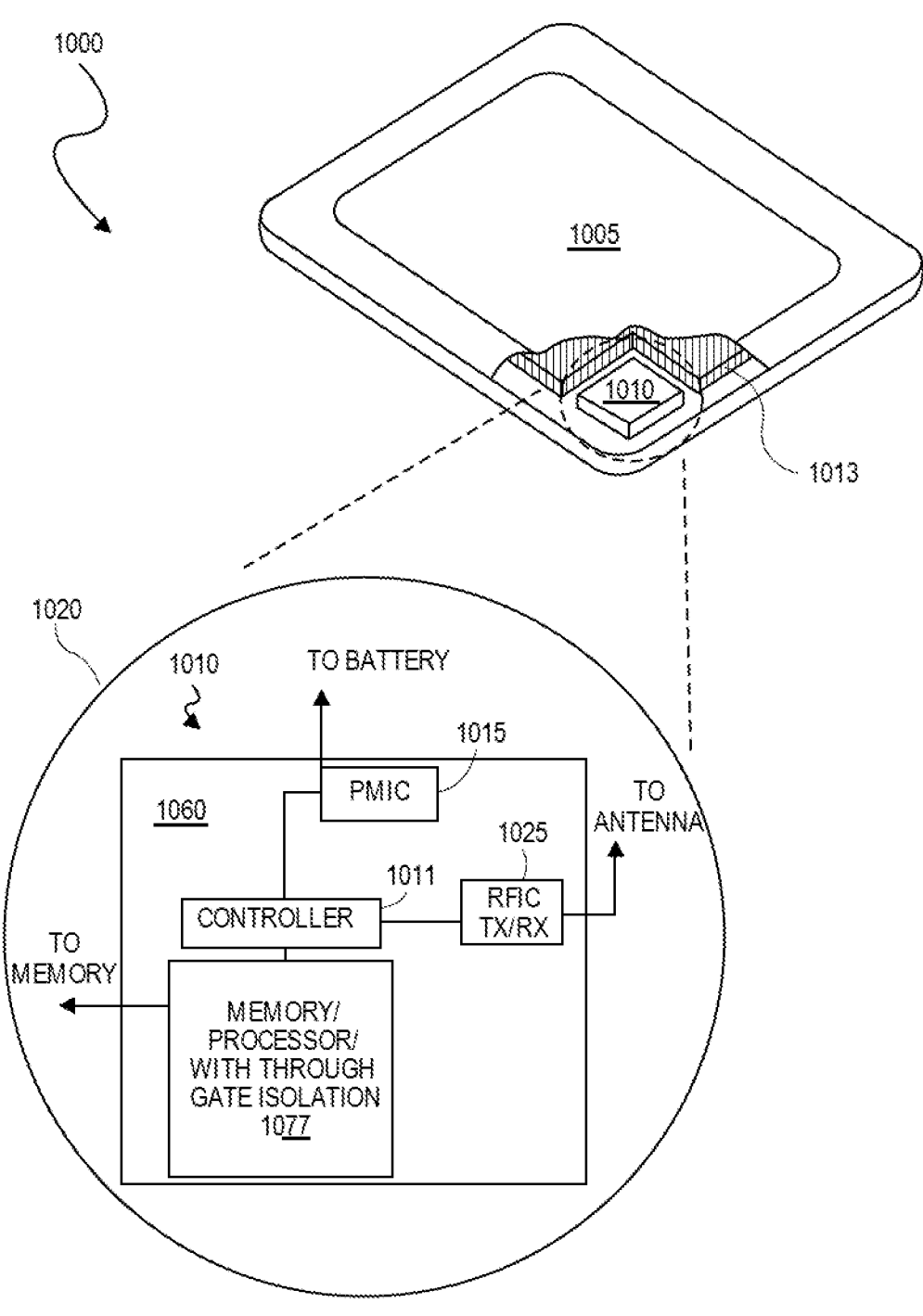
FIG. 10 is an isometric view of a mobile computing platform employing an IC fabricated according to one or more processes described herein or including one or more features described herein, in accordance with an embodiment of the present disclosure.

FIG. 10 is an isometric view of a mobile computing platform 1000 employing an integrated circuit (IC) fabricated according to one or more processes described herein or including one or more features described herein, in accordance with an embodiment of the present disclosure.

The mobile computing platform 1000 may be any portable device configured for each of electronic data display, electronic data processing, and wireless electronic data transmission. For example, mobile computing platform 1000 may be any of a tablet, a smart phone, laptop computer, etc. and includes a display screen 1005 which in the exemplary embodiment is a touchscreen (capacitive, inductive, resistive, etc.), a chip-level (SoC) or package-level integrated system 1010, and a battery 1013. As illustrated, the greater the level of integration in the system 1010 enabled by higher transistor packing density, the greater the portion of the mobile computing platform 1000 that may be occupied by the battery 1013 or non-volatile storage, such as a solid state drive, or the greater the transistor gate count for improved platform functionality. Similarly, the greater the carrier mobility of each transistor in the system 1010, the greater the functionality. As such, techniques described herein may enable performance and form factor improvements in the mobile computing platform 1000.

The integrated system 1010 is further illustrated in the expanded view 1020. In the exemplary embodiment, packaged device 1077 includes at least one memory chip (e.g., RAM), or at least one processor chip (e.g., a multi-core microprocessor and/or graphics processor) fabricated according to one or more processes described herein or including one or more features described herein. The packaged device 1077 is further coupled to the board 1060 along with one or more of a power management integrated circuit (PMIC) 1015, RF (wireless) integrated circuit (RFIC) 1025 including a wideband RF (wireless) transmitter and/or receiver (e.g., including a digital baseband and an analog front end module further includes a power amplifier on a transmit path and a low noise amplifier on a receive path), and a controller thereof 1011. Functionally, the PMIC 1015 performs battery power regulation, DC-to-DC conversion, etc., and so has an input coupled to the battery 1013 and with an output providing a current supply to all the other functional modules. As further illustrated, in the exemplary embodiment, the RFIC 1025 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 1077 or within a single IC (SoC) coupled to the package substrate of the packaged device 1077.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Figure 11:
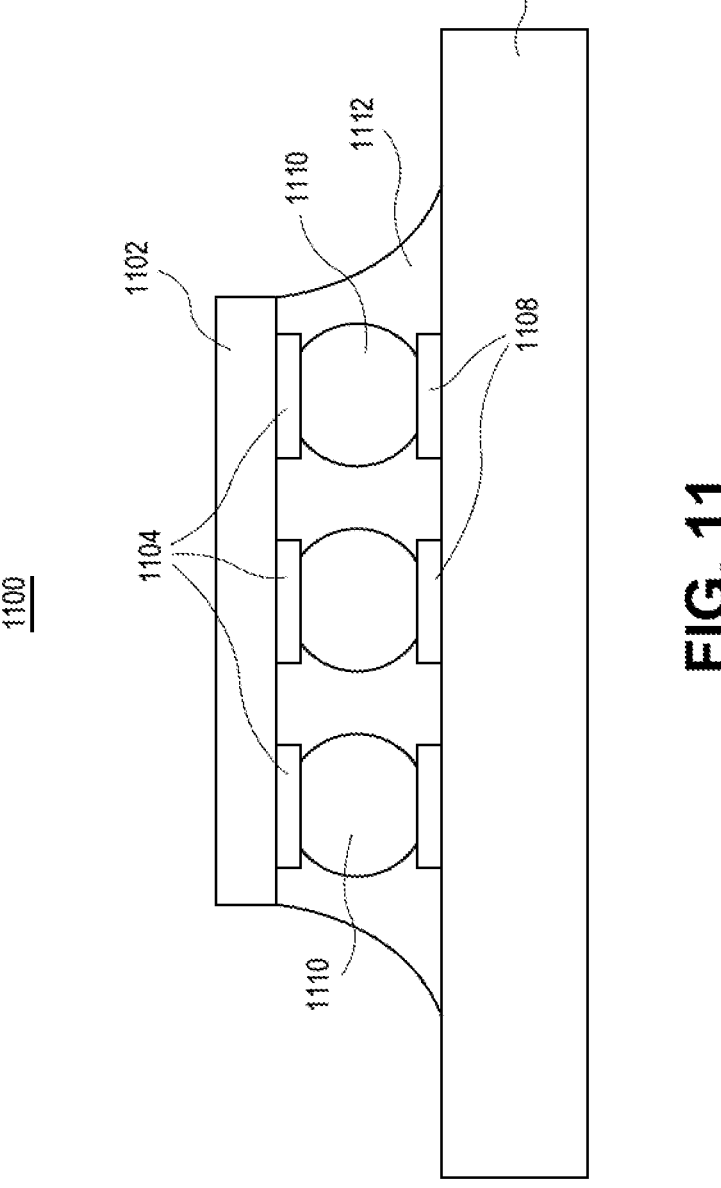
FIG. 11 illustrates a cross-sectional view of a flip-chip mounted die, in accordance with an embodiment of the present disclosure.

FIG. 11 illustrates a cross-sectional view of a flip-chip mounted die, in accordance with an embodiment of the present disclosure.

Referring to FIG. 11, an apparatus 1100 includes a die 1102 such as an integrated circuit (IC) fabricated according to one or more processes described herein or including one or more features described herein, in accordance with an embodiment of the present disclosure. The die 1102 includes metallized pads 1104 thereon. A package substrate 1106, such as a ceramic or organic substrate, includes connections 1108 thereon. The die 1102 and package substrate 1106 are electrically connected by solder balls 1110 coupled to the metallized pads 1104 and the connections 1108. An underfill material 1112 surrounds the solder balls 1110.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include contact over active gate (COAG) structures with a tapered gate or trench contact, and methods of fabricating contact over active gate (COAG) structures with a tapered gate or trench contact.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: An integrated circuit structure includes a plurality of gate structures above a substrate. A plurality of conductive trench contact structures is alternating with the plurality of gate structures. The integrated circuit structure also includes a plurality of dielectric spacers, a corresponding one of the plurality of dielectric spacers between adjacent ones of the plurality of gate structures and the plurality of conductive trench contact structures, wherein the plurality of dielectric spacers protrudes above the plurality of gate structures and above the plurality of conductive trench contact structures. A dielectric liner is over the plurality of gate structures, over the plurality of conductive trench contact structures, and over the plurality of dielectric spacers. An interlayer dielectric material is over the dielectric liner. An opening is in the interlayer dielectric material and in the dielectric liner, the opening exposing one of the plurality of gate structures. A conductive structure is in the opening, the conductive structure in direct contact with the one of the plurality of gate structures. The conductive structure has a flat edge along a direction across the one of the plurality of gate structures.

Example embodiment 2: The integrated circuit structure of example embodiment 1, wherein the opening exposes a portion of one of the plurality of dielectric spacers.

Example embodiment 3: The integrated circuit structure of example embodiment 1 or 2, wherein a portion of the conductive structure is vertically beneath the interlayer dielectric material.

Example embodiment 4: The integrated circuit structure of example embodiment 1, 2 or 3, wherein the conductive structure has an uppermost surface co-planar with an uppermost surface of the interlayer dielectric material.

Example embodiment 5: The integrated circuit structure of example embodiment 1, 2, 3 or 4, wherein the dielectric liner includes aluminum and oxygen, and the sidewall spacers include silicon and nitrogen.

Example embodiment 6: An integrated circuit structure includes a plurality of gate structures above a substrate. A plurality of conductive trench contact structures is alternating with the plurality of gate structures. The integrated circuit structure also includes a plurality of dielectric spacers, a corresponding one of the plurality of dielectric spacers between adjacent ones of the plurality of gate structures and the plurality of conductive trench contact structures, wherein the plurality of dielectric spacers protrudes above the plurality of gate structures and above the plurality of conductive trench contact structures. A dielectric liner is over the plurality of gate structures, over the plurality of conductive trench contact structures, and over the plurality of dielectric spacers. An interlayer dielectric material is over the dielectric liner. An opening is in the interlayer dielectric material and in the dielectric liner, the opening exposing one of the plurality of conductive trench contact structures. A conductive structure is in the opening, the conductive structure in direct contact with the one of the plurality of conductive trench contact structures. The conductive structure has a flat edge along a direction across the one of the plurality of conductive trench contact structures.

Example embodiment 7: The integrated circuit structure of example embodiment 6, wherein the opening exposes a portion of one of the plurality of dielectric spacers.

Example embodiment 8: The integrated circuit structure of example embodiment 6 or 7, wherein a portion of the conductive structure is vertically beneath the interlayer dielectric material.

Example embodiment 9: The integrated circuit structure of example embodiment 6, 7 or 8, wherein the conductive structure has an uppermost surface co-planar with an uppermost surface of the interlayer dielectric material.

Example embodiment 10: The integrated circuit structure of example embodiment 6, 7, 8 or 9, wherein the dielectric liner includes aluminum and oxygen, and the sidewall spacers include silicon and nitrogen.

Example embodiment 11: A computing device includes a board, and a component coupled to the board. The component includes an integrated circuit structure including a plurality of gate structures above a substrate. A plurality of conductive trench contact structures is alternating with the plurality of gate structures. The integrated circuit structure also includes a plurality of dielectric spacers, a corresponding one of the plurality of dielectric spacers between adjacent ones of the plurality of gate structures and the plurality of conductive trench contact structures, wherein the plurality of dielectric spacers protrudes above the plurality of gate structures and above the plurality of conductive trench contact structures. A dielectric liner is over the plurality of gate structures, over the plurality of conductive trench contact structures, and over the plurality of dielectric spacers. An interlayer dielectric material is over the dielectric liner. An opening is in the interlayer dielectric material and in the dielectric liner, the opening exposing one of the plurality of gate structures. A conductive structure is in the opening, the conductive structure in direct contact with the one of the plurality of gate structures. The conductive structure has a flat edge along a direction across the one of the plurality of gate structures.

Example embodiment 12: The computing device of example embodiment 11, further including a memory coupled to the board.

Example embodiment 13: The computing device of example embodiment 11 or 12, further including a communication chip coupled to the board.

Example embodiment 14: The computing device of example embodiment 11, 12 or 13, further including a camera coupled to the board.

Example embodiment 15: The computing device of example embodiment 11, 12, 13 or 14, wherein the component is a packaged integrated circuit die.

Example embodiment 16: A computing device includes a board, and a component coupled to the board. The component includes an integrated circuit structure including a plurality of gate structures above a substrate. A plurality of conductive trench contact structures is alternating with the plurality of gate structures. The integrated circuit structure also includes a plurality of dielectric spacers, a corresponding one of the plurality of dielectric spacers between adjacent ones of the plurality of gate structures and the plurality of conductive trench contact structures, wherein the plurality of dielectric spacers protrudes above the plurality of gate structures and above the plurality of conductive trench contact structures. A dielectric liner is over the plurality of gate structures, over the plurality of conductive trench contact structures, and over the plurality of dielectric spacers. An interlayer dielectric material is over the dielectric liner. An opening is in the interlayer dielectric material and in the dielectric liner, the opening exposing one of the plurality of conductive trench contact structures. A conductive structure is in the opening, the conductive structure in direct contact with the one of the plurality of conductive trench contact structures. The conductive structure has a flat edge along a direction across the one of the plurality of conductive trench contact structures.

Example embodiment 17: The computing device of example embodiment 16, further including a memory coupled to the board.

Example embodiment 18: The computing device of example embodiment 16 or 17, further including a communication chip coupled to the board.

Example embodiment 19: The computing device of example embodiment 16, 17 or 18, further including a camera coupled to the board.

Example embodiment 20: The computing device of example embodiment 16, 17, 18 or 19, wherein the component is a packaged integrated circuit die.

What is claimed is:

1. An integrated circuit structure, comprising:
a plurality of gate structures above a substrate;
a plurality of conductive trench contact structures alternating with the plurality of gate structures;
a plurality of dielectric spacers, a corresponding one of the plurality of dielectric spacers between adjacent ones of the plurality of gate structures and the plurality of conductive trench contact structures, wherein the plurality of dielectric spacers protrudes above the plurality of gate structures and above the plurality of conductive trench contact structures;
a dielectric liner over the plurality of gate structures, over the plurality of conductive trench contact structures, and over the plurality of dielectric spacers;
an interlayer dielectric material over the dielectric liner;
an opening in the interlayer dielectric material and in the dielectric liner, the opening exposing one of the plurality of gate structures; and
a conductive structure in the opening, the conductive structure in direct contact with the one of the plurality of gate structures, and the conductive structure having a flat edge along a direction across the one of the plurality of gate structures in a plan view perspective, wherein a portion of the conductive structure is vertically beneath the interlayer dielectric material.

2. The integrated circuit structure of claim 1, wherein the opening exposes a portion of one of the plurality of dielectric spacers.

3. The integrated circuit structure of claim 1, wherein the conductive structure has an uppermost surface co-planar with an uppermost surface of the interlayer dielectric material.

4. The integrated circuit structure of claim 1, wherein the dielectric liner comprises aluminum and oxygen, and the sidewall spacers comprise silicon and nitrogen.

5. A computing device, comprising:
a board; and
a component coupled to the board, the component including an integrated circuit structure,
comprising:
a plurality of gate structures above a substrate;
a plurality of conductive trench contact structures alternating with the plurality of gate structures;
a plurality of dielectric spacers, a corresponding one of the plurality of dielectric spacers between adjacent ones of the plurality of gate structures and the plurality of conductive trench contact structures, wherein the plurality of dielectric spacers protrudes above the plurality of gate structures and above the plurality of conductive trench contact structures;
a dielectric liner over the plurality of gate structures, over the plurality of conductive trench contact structures, and over the plurality of dielectric spacers;
an interlayer dielectric material over the dielectric liner;
an opening in the interlayer dielectric material and in the dielectric liner, the opening exposing one of the plurality of gate structures; and
a conductive structure in the opening, the conductive structure in direct contact with the one of the plurality of gate structures, and the conductive structure having a flat edge along a direction across the one of the plurality of gate structures in a plan view perspective, wherein a portion of the conductive structure is vertically beneath the interlayer dielectric material.

6. The computing device of claim 5, further comprising: a memory coupled to the board.

7. The computing device of claim 5, further comprising: a communication chip coupled to the board.

8. The computing device of claim 5, further comprising: a camera coupled to the board.

9. The computing device of claim 5, wherein the component is a packaged integrated circuit die.

10. An integrated circuit structure, comprising:
a plurality of gate structures above a substrate;
a plurality of conductive trench contact structures alternating with the plurality of gate structures;
a plurality of dielectric spacers, a corresponding one of the plurality of dielectric spacers between adjacent ones of the plurality of gate structures and the plurality of conductive trench contact structures, wherein the plurality of dielectric spacers protrudes above the plurality of gate structures and above the plurality of conductive trench contact structures;
a dielectric liner over the plurality of gate structures, over the plurality of conductive trench contact structures, and over the plurality of dielectric spacers;
an interlayer dielectric material over the dielectric liner;
an opening in the interlayer dielectric material and in the dielectric liner, the opening exposing one of the plurality of gate structures; and
a conductive structure in the opening, the conductive structure in direct contact with the one of the plurality of gate structures, and the conductive structure having a flat edge along a direction across the one of the plurality of gate structures, wherein a portion of the conductive structure is vertically beneath the interlayer dielectric material.

* * * * *